US010817626B2

(12) United States Patent
Wright et al.

(10) Patent No.: US 10,817,626 B2
(45) Date of Patent: Oct. 27, 2020

(54) DESIGN-MODEL MANAGEMENT

(71) Applicant: MITEK HOLDINGS, INC., Wilmington, DE (US)

(72) Inventors: William A. Wright, Lexington, MA (US); Michael G. Shnitman, Newton, MA (US)

(73) Assignee: MITEK HOLDINGS, INC., Wilmington, DE (US)

(*) Notice: Subject to any disclaimer, the term of this patent is extended or adjusted under 35 U.S.C. 154(b) by 189 days.

(21) Appl. No.: 15/219,381

(22) Filed: Jul. 26, 2016

(65) Prior Publication Data

US 2018/0032643 A1    Feb. 1, 2018

(51) Int. Cl.
*G06F 30/13*    (2020.01)
*G06F 30/18*    (2020.01)

(52) U.S. Cl.
CPC .............. *G06F 30/13* (2020.01); *G06F 30/18* (2020.01)

(58) Field of Classification Search
CPC ....... G06F 17/5004; G06F 30/13; G06F 30/18
USPC ........................................................... 703/1
See application file for complete search history.

(56) References Cited

U.S. PATENT DOCUMENTS

| | | | |
|---|---|---|---|
| 7,072,727 B1 | 7/2006 | Davis | |
| 7,499,839 B2 | 3/2009 | Massaro et al. | |
| 7,917,340 B2* | 3/2011 | Massaro | G06F 17/5004 700/182 |
| 8,994,726 B1 | 3/2015 | Furukawa et al. | |
| 2001/0037190 A1 | 11/2001 | Jung | |
| 2004/0037474 A1* | 2/2004 | Happel | G06K 9/6206 382/280 |
| 2004/0239494 A1* | 12/2004 | Kennedy | G06Q 30/02 340/500 |
| 2006/0008119 A1* | 1/2006 | Chang | G06K 9/00208 382/103 |
| 2007/0198231 A1* | 8/2007 | Walch | G06F 17/5004 703/1 |
| 2007/0219764 A1 | 9/2007 | Backe et al. | |
| 2008/0120068 A1 | 5/2008 | Martin et al. | |
| 2008/0120069 A1* | 5/2008 | Martin | G06F 17/5004 703/1 |
| 2008/0249756 A1 | 10/2008 | Chaisuparasmikul | |
| 2009/0271154 A1 | 10/2009 | Coad et al. | |
| 2011/0153524 A1 | 6/2011 | Schnackel | |
| 2011/0218777 A1 | 9/2011 | Chen | |

(Continued)

OTHER PUBLICATIONS

Charles S. Barnaby, Mikhail Shnitman, William A. Wright, "HVAC System Desing Automation: Issues, Methods, and Ultimate Limits" Seventh International IBPSA Confernece, Aug. 13-15, 2001, pp. 1151-1158.*

(Continued)

*Primary Examiner* — Juan C Ochoa
(74) *Attorney, Agent, or Firm* — Stinson LLP

(57) ABSTRACT

Disclosed aspects relate to design-model management associated with an architectural layout. A set of architectural objects may be ingested from a data source. In response to ingesting the set of architectural objects, a set of spatial zones may be determined. The determination can be made based on the ingestion of the set of architectural objects. In response to determining the set of spatial zones, a design-model of the architectural layout may be established. The establishment of the design-model can be based on the set of spatial zones.

17 Claims, 13 Drawing Sheets

(56) References Cited

U.S. PATENT DOCUMENTS

| | | | |
|---|---|---|---|
| 2012/0072181 A1 | 3/2012 | Imani | |
| 2012/0110595 A1* | 5/2012 | Reitman | G06F 17/50 719/313 |
| 2012/0259594 A1 | 10/2012 | Khan et al. | |
| 2012/0296609 A1 | 11/2012 | Khan et al. | |
| 2013/0066473 A1 | 3/2013 | Smith et al. | |
| 2013/0151013 A1 | 6/2013 | Nikovski et al. | |
| 2013/0261833 A1* | 10/2013 | Meghani | G06Q 50/06 700/297 |
| 2014/0039844 A1 | 2/2014 | Strelec et al. | |
| 2014/0039845 A1 | 2/2014 | K M et al. | |
| 2014/0320488 A1 | 10/2014 | Ege | |
| 2015/0046206 A1* | 2/2015 | Kelley | G06Q 10/06311 705/7.13 |
| 2015/0323394 A1* | 11/2015 | Alsaleem | G01K 13/00 702/130 |
| 2015/0347671 A1 | 12/2015 | Kiff | |
| 2016/0162605 A1* | 6/2016 | Morton | G06F 17/11 703/1 |

OTHER PUBLICATIONS

User Manual IDA Indoor Climate and Energy, Verions 4.5 EQUA Simulation AB, Feb. 2013, pp. 1-179.*

Charles S. Barnaby, Mikhail Shnitman, William A. Wright, "HVAC System Design Automation: Issues, Methods, and Ultimate Limits" Seventh International IBPSA Conference, Rie deJaneiro, Brazil Aug. 13-15, 2001. pp. 1151-1158.*

Roche, James, How to Read a Floor Plan, Time to Build, <http://blog.houseplans.com/article/how-to-read-a-floor-plan>.

List of Wrightsoft Patents or Patent Applications Treated as Related.

E. Subrahmanian; S. Rachuri; S. Fenves; R. Sriram; "Product lifecycle management support: A challenge in supporting product design and manufacturing in a networked economy" NIST National Institute of Standards and Technology, NISTIR 7211, Mar. 2005, 23 pages.

Andew J. Marsh; "Thermal Modelling: The ECOTECT Way" ISSN: 1833-7570; Issue No. 002, Aug. 1, 2006, 17 pages.

Robina Hetherington, Robin Laney, Stephen Peake; "Zone Modelling and Visualization: Keys to the Design of Low Crabon Buildings" May 1, 2012, 9 pages.

* cited by examiner

1100

1200

DESIGN-MODEL MANAGEMENT

BACKGROUND

This disclosure relates generally to computer systems and, more particularly, relates to management of data associated with an architectural layout. The amount of data that needs to be managed by enterprises is increasing. Management of data associated with architectural layouts may be desired to be performed as efficiently as possible. As data needing to be managed increases, the need for management efficiency may increase.

SUMMARY

Aspects of the disclosure use an input of an architectural layout to generate an output of a design-model. Aspects may use pattern recognition techniques to transform an architectural layout of a building into a design-oriented representation of the building. Walls may be extracted from an imprecise data source such as an imperfect drawing to form rooms which can then be used to create the design-model. As such, the architectural layout configured to represent plans for a building may be transformed into a design-model for use in various aspects of building design such as energy distribution efficiency. For example, utilizing aspects described herein, spatial zones for the building may be generated and a heating, ventilation, and air conditioning (HVAC) design-model may be established.

Aspects of the disclosure relate to design-model management associated with an architectural layout. A set of architectural objects may be ingested from a data source. In response to ingesting the set of architectural objects, a set of spatial zones may be determined. The determination can be made based on the ingestion of the set of architectural objects. In response to determining the set of spatial zones, a design-model of the architectural layout may be established. The establishment of the design-model can be based on the set of spatial zones.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
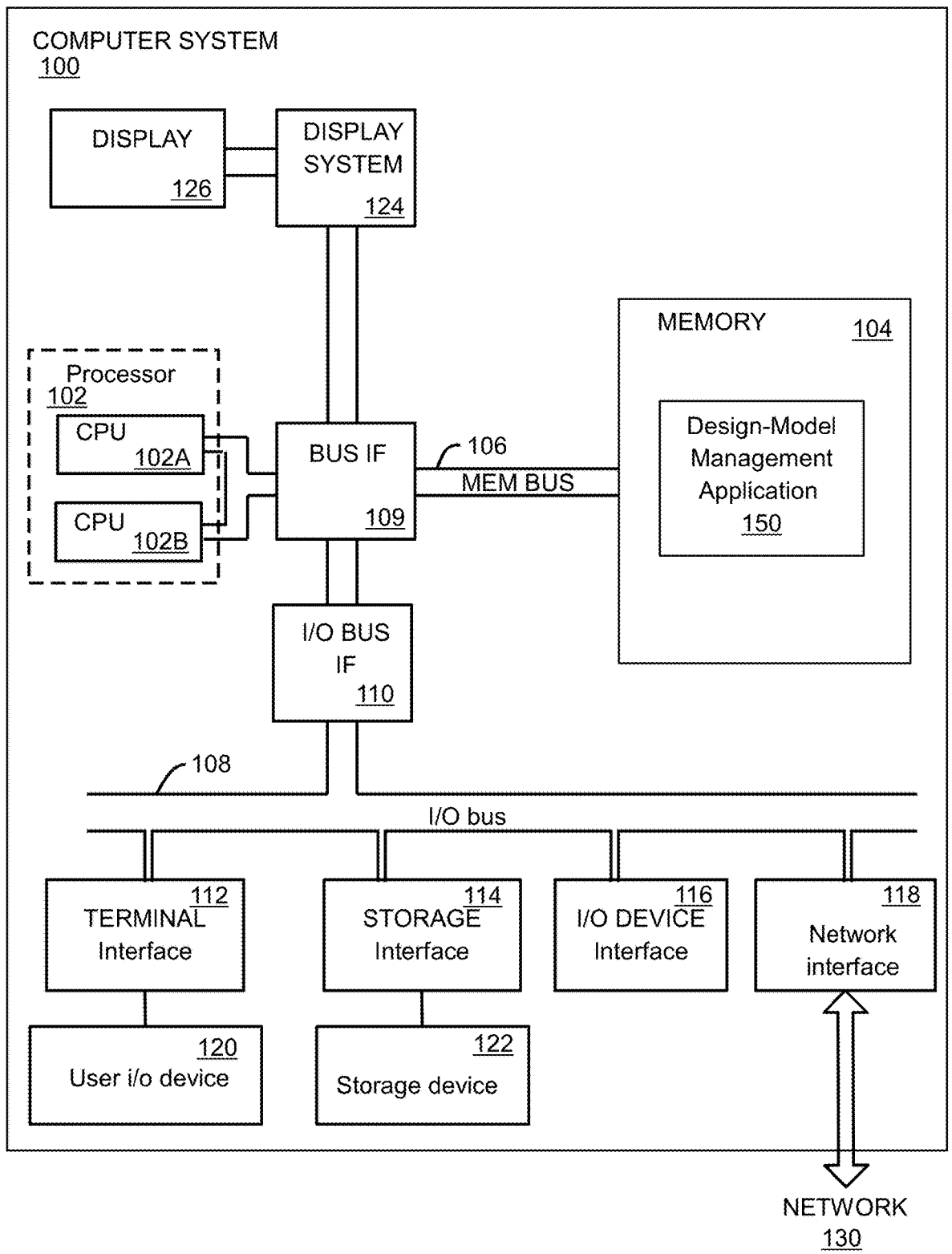
FIG. 1 depicts a high-level block diagram of a computer system for implementing various embodiments of the present disclosure, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure use an input of an architectural layout to generate an output of a design-model. Aspects may use pattern recognition techniques to transform an architectural layout of a building into a design-oriented representation of the building. Walls may be extracted from an imprecise data source such as an imperfect drawing to form rooms which can then be used to create the design-model. As such, the architectural layout configured to represent plans for a building may be transformed into a design-model for use in various aspects of building design such as energy distribution efficiency. For example, utilizing aspects described herein, spatial zones for the building may be generated and a heating, ventilation, and air conditioning (HVAC) design-model may be established.

Various types of data sources for architectural layouts of buildings exist. Different data sources can have distinct languages for their design. Deciphering particular languages can pose performance/efficiency challenges when, for example, attempting to compute components with respect to the building (e.g., components related to energy distribution). Computations which use features of floors, ceilings, interior walls, or exterior walls can be negatively impacted by a less-than-desirable translation of such features. For instance, outside surfaces of the building may be particularly consequential for thermal load calculations. As such, computations may be positively impacted by appropriately determining rooms/walls from one or more of the various types of data sources for architectural layouts of buildings.

Aspects of the disclosure include a method, system, and computer program product for design-model management associated with an architectural layout. A set of architectural objects (e.g., lines, arcs, symbols) may be ingested from a data source. The set of architectural objects can represent a set of architectural features (e.g., walls, windows, doors) of the architectural layout. In embodiments, the ingestion includes analyzing the set of architectural objects and mapping them to a set of object data. Accordingly, the set of object data can correspond with a subset of the set of architectural features (e.g., walls). In certain embodiments, the ingestion of the set of architectural objects may be normalized for utilization when determining the set of spatial zones.

In response to ingesting the set of architectural objects, a set of spatial zones (e.g., rooms) may be determined. The determination can be made based on the ingestion of the set of architectural objects. In embodiments, the determination includes processing the set of object data and computing the set of spatial zones. In embodiments, the determination includes determining that the ingestion of the set of architectural objects indicates a set of polytopes for the set of spatial zones. In various embodiments, a plurality of spatial zones may be converted (e.g., merged, divided) based on a threshold size factor for a spatial zone.

In response to determining the set of spatial zones, a design-model of the architectural layout may be established. The establishment of the design-model can be based on the set of spatial zones. In embodiments, the establishment of the design-model includes establishing a group of polytopes which indicates the set of spatial zones. In embodiments, the design-model includes a heating, ventilation, and air conditioning (HVAC) design-model. Aspects of the disclosure can include performance or efficiency benefits (e.g., speed, flexibility, responsiveness, resource usage) for design-model management associated with an architectural layout. For example, resources such as bandwidth, processing, or memory may be saved.

Turning now to the figures, FIG. 1 depicts a high-level block diagram of a computer system for implementing various embodiments of the present disclosure, consistent with various embodiments. The mechanisms and apparatus of the various embodiments disclosed herein apply equally to any appropriate computing system. The major components of the computer system 100 include one or more processors 102, a memory 104, a terminal interface 112, a storage interface 114, an I/O (Input/Output) device interface 116, and a network interface 118, all of which are communicatively coupled, directly or indirectly, for inter-component communication via a memory bus 106, an I/O bus 108, bus interface unit 109, and an I/O bus interface unit 110.

The computer system 100 may contain one or more general-purpose programmable central processing units (CPUs) 102A and 102B, herein generically referred to as the processor 102. In embodiments, the computer system 500 may contain multiple processors; however, in certain embodiments, the computer system 100 may alternatively be a single CPU system. Each processor 102 executes instructions stored in the memory 104 and may include one or more levels of on-board cache.

In embodiments, the memory 104 may include a random-access semiconductor memory, storage device, or storage medium (either volatile or non-volatile) for storing or encoding data and programs. In certain embodiments, the memory 104 represents the entire virtual memory of the computer system 100, and may also include the virtual memory of other computer systems coupled to the computer system 100 or connected via a network. The memory 104 can be conceptually viewed as a single monolithic entity, but in other embodiments the memory 104 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 104 may store all or a portion of the various programs, modules and data structures for processing data transfers as discussed herein. For instance, the memory 104 can store a design-model management application 150. In embodiments, the design-model management application 150 may include instructions or statements that execute on the processor 102 or instructions or statements that are interpreted by instructions or statements that execute on the processor 102 to carry out the functions as further described below. In certain embodiments, the design-model management application 150 is implemented in hardware via semiconductor devices, chips, logical gates, circuits, circuit cards, and/or other physical hardware devices in lieu of, or in addition to, a processor-based system. In embodiments, the design-model management application 150 may include data in addition to instructions or statements.

The computer system 100 may include a bus interface unit 109 to handle communications among the processor 102, the memory 104, a display system 124, and the I/O bus interface unit 110. The I/O bus interface unit 110 may be coupled with the I/O bus 108 for transferring data to and from the various I/O units. The I/O bus interface unit 110 communicates with multiple I/O interface units 112, 114, 116, and 118, which are also known as I/O processors (IOPs) or I/O adapters (IOAs), through the I/O bus 108. The display system 124 may include a display controller, a display memory, or both. The display controller may provide video, audio, or both types of data to a display device 126. The display memory may be a dedicated memory for buffering video data. The display system 124 may be coupled with a display device 126, such as a standalone display screen, computer monitor, television, or a tablet or handheld device display. In one embodiment, the display device 126 may include one or more speakers for rendering audio. Alternatively, one or more speakers for rendering audio may be coupled with an I/O interface unit. In alternate embodiments, one or more of the functions provided by the display system 124 may be on board an integrated circuit that also includes the processor 102. In addition, one or more of the functions provided by the bus interface unit 109 may be on board an integrated circuit that also includes the processor 102.

The I/O interface units support communication with a variety of storage and I/O devices. For example, the terminal interface unit 112 supports the attachment of one or more user I/O devices 120, which may include user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 120 and the computer system 100, and may receive output data via the user output devices. For example, a user interface may be presented via the user I/O device 120, such as displayed on a display device, played via a speaker, or printed via a printer.

The storage interface 114 supports the attachment of one or more disk drives or direct access storage devices 122 (which are typically rotating magnetic disk drive storage devices, although they could alternatively be other storage devices, including arrays of disk drives configured to appear as a single large storage device to a host computer, or solid-state drives, such as flash memory). In some embodiments, the storage device 122 may be implemented via any type of secondary storage device. The contents of the memory 104, or any portion thereof, may be stored to and retrieved from the storage device 122 as needed. The I/O device interface 116 provides an interface to any of various other I/O devices or devices of other types, such as printers or fax machines. The network interface 118 provides one or more communication paths from the computer system 100 to other digital devices and computer systems; these communication paths may include, e.g., one or more networks 130.

Figure 5:
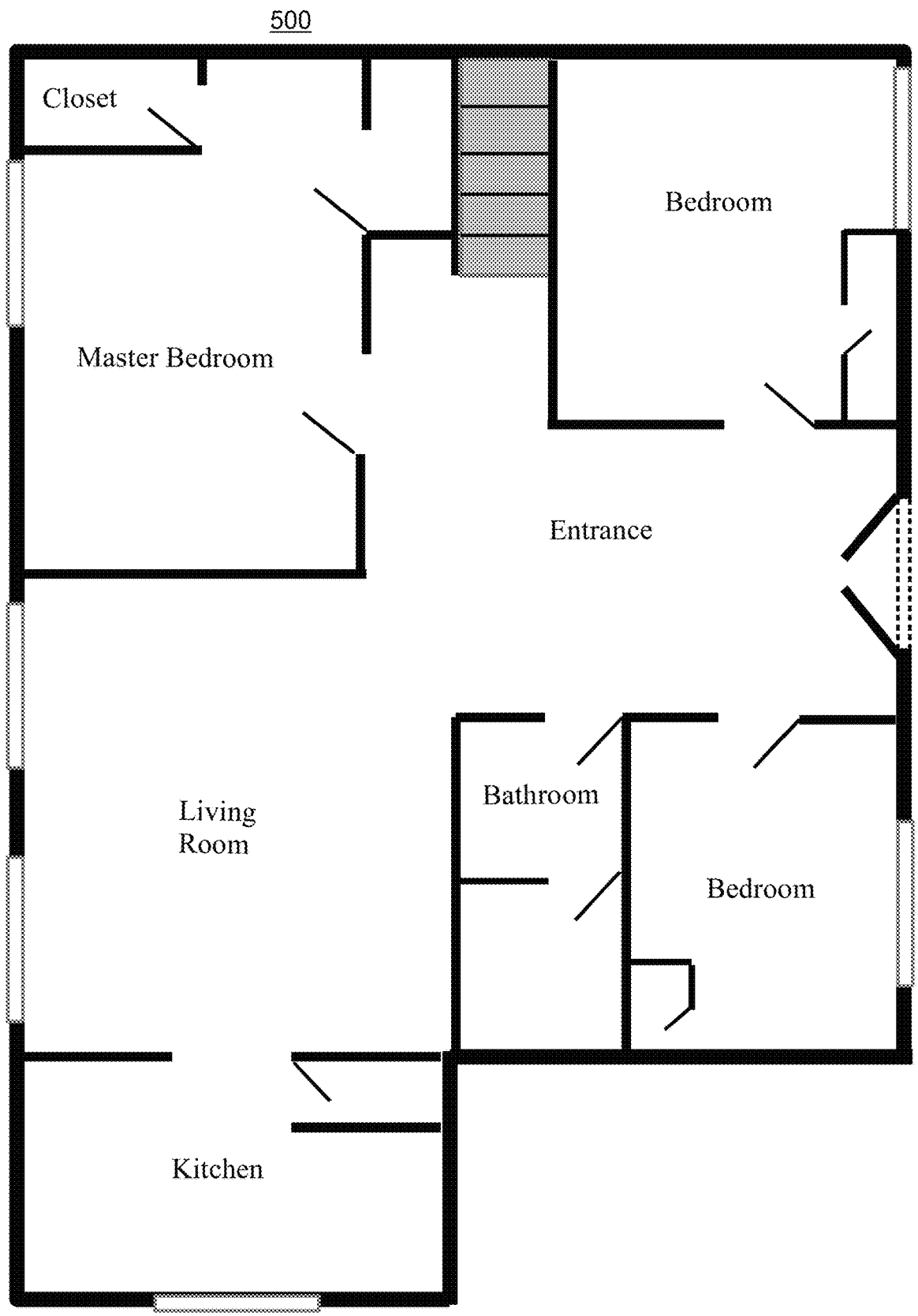
FIG. 5 depicts an example architectural layout of a building in a first phase, according to embodiments.

Although the computer system 100 shown in FIG. 5 illustrates a particular bus structure providing a direct communication path among the processors 102, the memory 104, the bus interface 109, the display system 124, and the I/O bus interface unit 110, in alternative embodiments the computer system 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 110 and the I/O bus 108 are shown as single respective units, the computer system 100 may, in fact, contain multiple I/O bus interface units 110 and/or multiple I/O buses 108. While multiple I/O interface units are shown, which separate the I/O bus 108 from various communications paths running to the various I/O devices, in other embodiments, some or all of the I/O devices are connected directly to one or more system I/O buses.

In various embodiments, the computer system 100 is a multi-user mainframe computer system, a single-user system, or a server computer or similar device that has little or no direct user interface, but receives requests from other computer systems (clients). In other embodiments, the computer system 100 may be implemented as a desktop computer, portable computer, laptop or notebook computer, tablet computer, pocket computer, telephone, smart phone, or any other suitable type of electronic device.

FIG. 1 depicts several major components of the computer system 100. Individual components, however, may have greater complexity than represented in FIG. 1, components other than or in addition to those shown in FIG. 1 may be present, and the number, type, and configuration of such components may vary. Several particular examples of additional complexity or additional variations are disclosed herein; these are by way of example only and are not necessarily the only such variations. The various program components illustrated in FIG. 1 may be implemented, in various embodiments, in a number of different manners, including using various computer applications, routines, components, programs, objects, modules, data structures, etc., which may be referred to herein as "software," "computer programs," or simply "programs."

Figure 2:
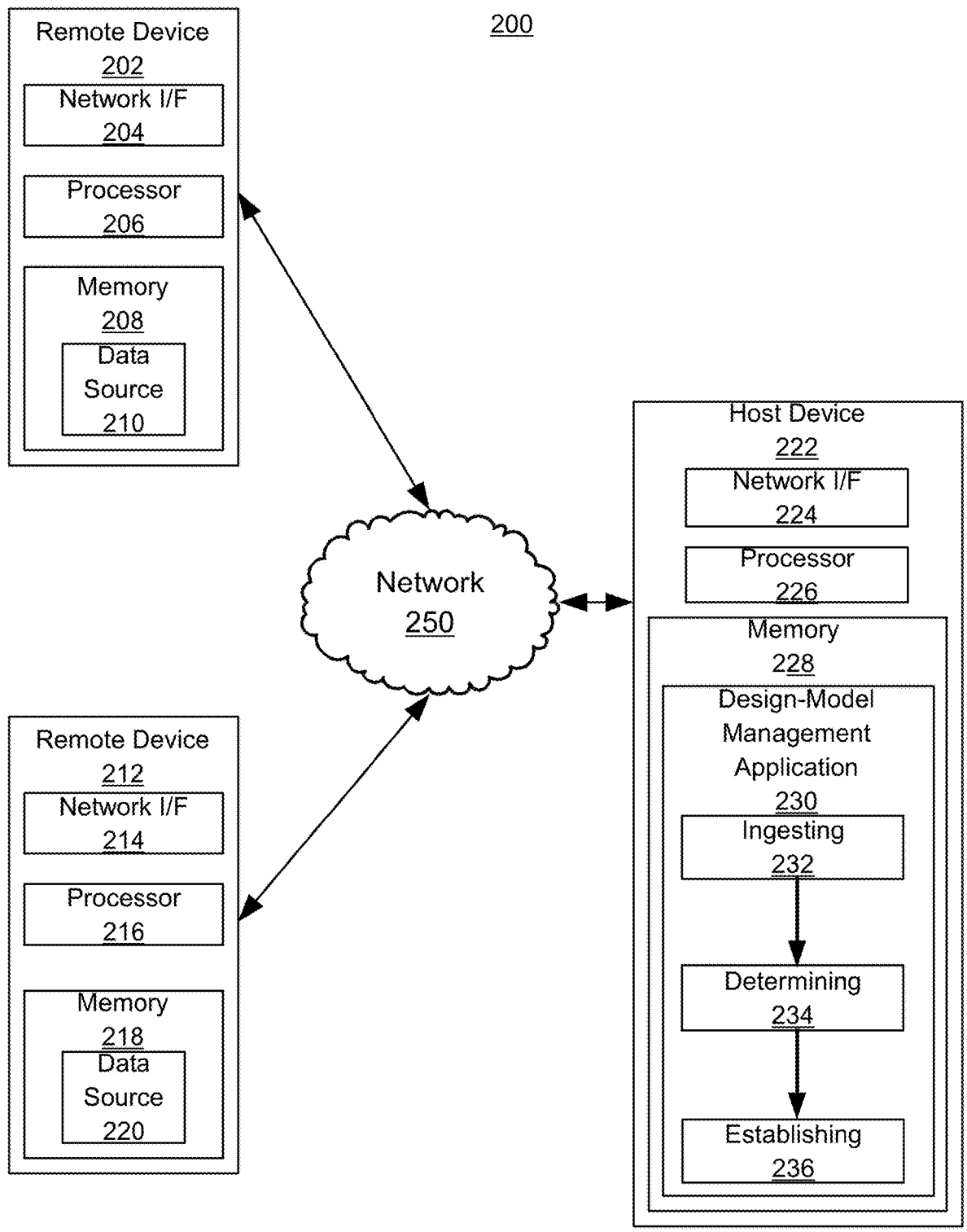
FIG. 2 is a system diagram depicting a high level logical architecture for a design-model management system, according to embodiments.

FIG. 2 is a diagrammatic illustration of an example computing environment 200, consistent with embodiments of the present disclosure. In certain embodiments, the environment 200 can include one or more remote devices 202, 212 and one or more host devices 222. Remote devices 202, 212 and host device 222 may be distant from each other and communicate over a network 250 in which the host device 222 comprises a central hub from which remote devices 202, 212 can establish a communication connection. Alternatively, the host device and remote devices may be configured in any other suitable relationship (e.g., in a peer-to-peer or other relationship).

In certain embodiments the network 250 can be implemented by any number of any suitable communications media (e.g., wide area network (WAN), local area network (LAN), Internet, Intranet, etc.). Alternatively, remote devices 202, 12 and host devices 222 may be local to each other, and communicate via any appropriate local communication medium (e.g., local area network (LAN), hardwire, wireless link, Intranet, etc.). In certain embodiments, the network 250 can be implemented within a cloud computing environment, or using one or more cloud computing services. Consistent with various embodiments, a cloud computing environment can include a network-based, distributed data processing system that provides one or more cloud computing services. In certain embodiments, a cloud computing environment can include many computers, hundreds or thousands of them, disposed within one or more data centers and configured to share resources over the network.

Consistent with various embodiments, host device 222 and remote devices 202, 212 may include computer systems preferably equipped with a display or monitor. In certain embodiments, the computer systems may include at least one processor 206, 216, 226 memories 208, 218, 228 and/or internal or external network interface or communications devices 204, 214, 224 (e.g., modem, network cards, etc.), optional input devices (e.g., a keyboard, mouse, or other input device), and other commercially available and custom software (e.g., browser software, communications software, server software, natural language processing software, search engine and/or web crawling software, filter modules for filtering content based upon predefined criteria, etc.). In certain embodiments, the computer systems may include server, desktop, laptop, and hand-held devices.

In certain embodiments, remote devices 202, 212 may include a data source 210, 220. The data source 210, 220 may include a database, corpus, or other data storage system configured to communicate with the host device 222. The data source 210 may be configured to provide data (e.g., a set of architectural objects, architectural layout, building blueprints, PDF files, ACA files, structural photos) to the host device 222 for processing (e.g., ingestion). As described herein, the design-model management application 230 of the host device 222 may be configured to manage a design-model associated with an architectural layout (and may be implemented by a combination of other software and/or hardware modules or units).

The design-model management application 230 may use data/information from one or more data sources such as data source 210 or data source 220. For example, an input of an architectural file can be transformed in a manner so as to establish a design-model related to a generated building description (e.g., which uses entities for rooms/walls/windows/doors). As such, aspects can establish a design-model that can be configured to efficiently manage energy distribution design attributes, for instance. The design-model management application 230 may have a set of operations. The set of operations can include an ingesting operation 232, a determining operation 234, or an establishing operation 236.

The ingesting operation 232 ingests a set of architectural objects from the data source. The set of architectural objects can represent a set of architectural features (e.g. walls, windows, doors, floors, ceilings) of the architectural layout. Aspects can be multidimensional (e.g., two-dimensional, three-dimensional). Ingesting can include detecting, collecting, or processing. For example, the architectural file may be received and subsequently analyzed (e.g., including analyzing external references). Entities such as walls, windows, or doors can be sensed/identified therein. In embodiments, certain entities may be filtered-out (e.g., appliances). Entities may be captured into memory or internal data structures. In embodiments, entities (e.g., from the architectural file in memory) may be transformed or mapped to similar yet distinct entities (e.g., formatted differently for performance or efficiency benefits). Ingesting can include data analysis such as a process of inspecting, cleaning, transforming, or modeling data to discover useful information, suggest conclusions, or support decisions. Data analysis can extract information/patterns from a data set and transform/translate it into an understandable structure (e.g., a data object/entity which can be provided/furnished) for further use.

The determining operation 234 determines a set of spatial zones based on the ingestion of the set of architectural objects. The set of spatial zones may indicate rooms of the architectural layout or building (e.g., or zones to be treated like rooms). In embodiments, the determination includes processing a set of object data and computing the set of spatial zones. For example, representations of walls (or sometimes doors, windows, floors, ceilings) may be utilized as a basis for the set of spatial zones. The ingestion of the set of architectural objects may be analyzed to make the determination. For instance, analyzing can include extracting (e.g., creating a derivation), examining (e.g., performing an inspection), evaluating (e.g., generating an appraisal), dissecting (e.g., scrutinizing an attribute), resolving (e.g., ascertaining an observation/conclusion/answer), parsing (e.g., deciphering a construct), searching (e.g., exploring for a reason/ground/motivation), comparing (e.g., relating an assessment), classifying (e.g., assigning a designation), or categorizing (e.g., organizing by a feature). In various embodiments, data analysis or analyzing may be distributed across the ingesting operation 232 or the determining operation 234 (e.g., percentages of 50-50, 25-75, 75-25, 0-100, 100-0) or occur between the two operations. In certain embodiments, normalization operation(s) may occur in a similar distribution pattern as the data analysis or analyzing.

The establishing operation 236 establishes a design-model of the architectural layout. The establishment of the design-model may be based on the set of spatial zones. The design-model can have elements/components with appropriate identifiers, geometry, and level assignments. The design-model may be multidimensional or can include a virtual model. The design-model can include a calculation, a form, a configuration, an arrangement, a pattern, a prototype, or an organization. Establishing can include creating, generating, tracing, structuring, constructing, outputting, forming, organizing, providing, or presenting. In certain embodiments, the design-model includes a heating, ventilation, and air conditioning (HVAC) design-model for an HVAC system proposed to be constructed in the building.

In embodiments, the operational steps such as the ingesting, the determining, and the establishing each occur in an automated fashion without user intervention or manual action (e.g., using automated computing machinery, fully machine-driven without manual stimuli). The automated operational steps may be performed by a design-model management engine (e.g., as part of an HVAC design management system). Altogether, aspects of the design-model management application 230 can include performance or efficiency benefits (e.g., speed for task completion, flexibility with respect to receiving various types of data/information, responsiveness of design-model production, resource usage to limit burdensome activities) for design-model management associated with an architectural layout.

Figure 3:
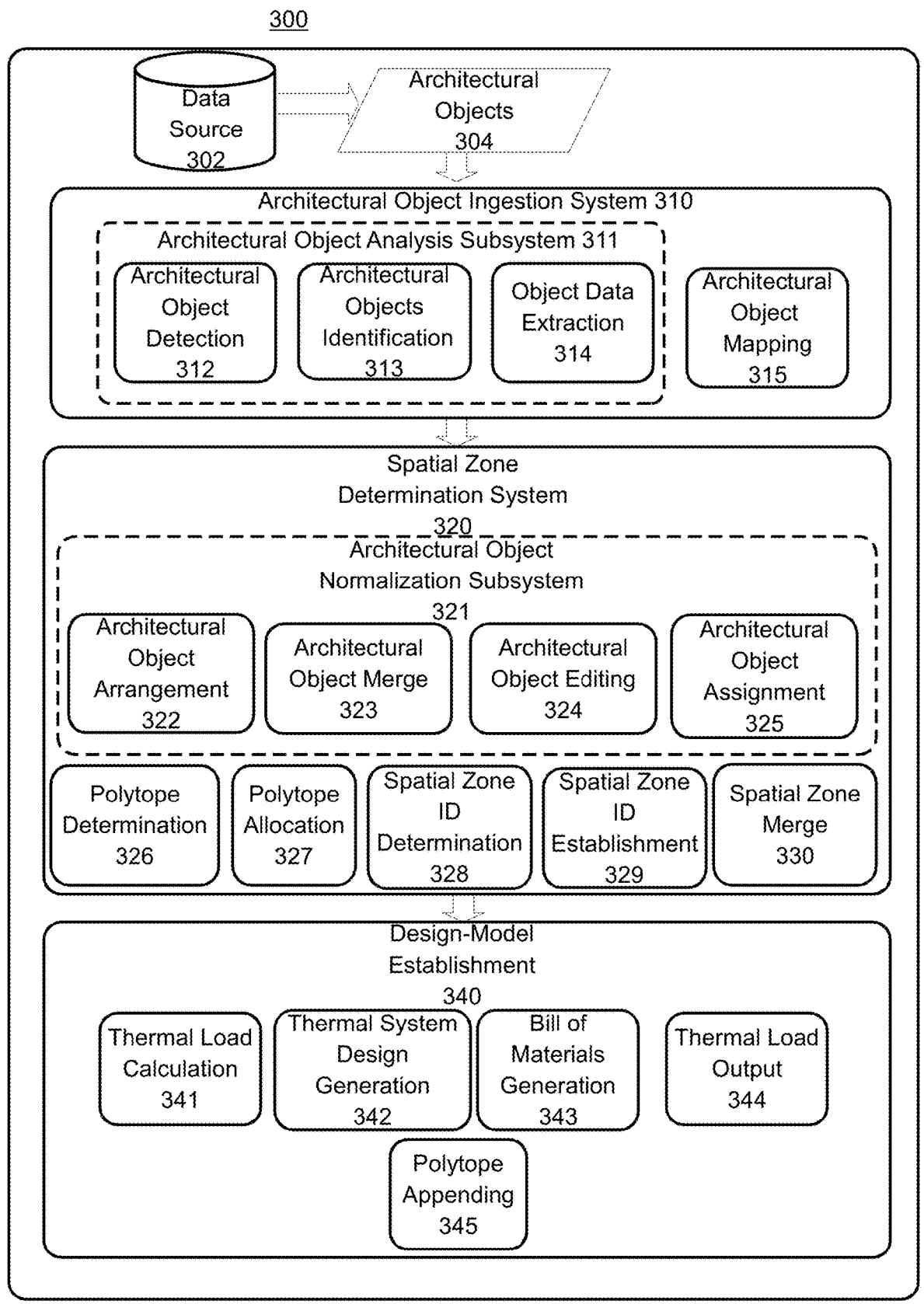
FIG. 3 is a block diagram illustrating a design-model management system according to embodiments.

FIG. 3 is a block diagram illustrating a design-model management system 300, consistent with various embodiments. Aspects of FIG. 3 may be directed toward ingesting a set of architectural objects from a data source, determining a set of spatial zones (e.g., rooms) based on the set of architectural objects, and establishing a design-model associated with an architectural layout. Aspects described with respect to FIG. 2 may be incorporated with respect to FIG. 3 (and likewise aspects described may be incorporated elsewhere herein). The design-model management system 300 may include a number of sub-systems and modules configured to execute operations of a method for managing the design-module. As shown in FIG. 3, the design-model management system 300 may include a data source 302, set of architectural objects 304, architectural object ingestion system 310, spatial zone determination system 320, and a design-model establishment system 340. Other systems, modules, and operations in keeping with the scope and spirit of the disclosure are also possible.

The data source 302 may include electronic and non-electronic mediums including blueprints, floor plans, raw files, digital files (e.g., ACA files, image files, PDF files, scanned documents), aerial/satellite images, photographs, and other means of data storage. Put differently, the data source 302 may include the medium or means of conveying the architectural layout (e.g., digital file, hand-drawn blueprint), while the architectural layout may include the data (e.g., lines, shapes, symbols,) that make up the graphical representation of the building and its architecture. The architectural layout may have one or more levels/layers. As described herein, the building may be modeled using include two-dimensional, three-dimensional, or multidimensional objects, one or more levels/layers, data structures, or images. Data sources other than those mentioned explicitly herein are also possible.

Aspects of the disclosure may include ingesting a set of architectural objects 304 associated with an architectural layout. Generally, the architectural layout may include a plan or design that depicts the structural arrangement and physical characteristics of a building. For instance, the architectural layout may include a two-dimensional or three-dimensional diagram of the structural arrangement of a residential building (e.g., house), commercial building (e.g., office building, retail store), industrial building (e.g., factory) or other physical structures (arenas, parking ramps, swimming pools, space stations). The architectural layout may be populated by the set of architectural objects 304. The set of architectural objects 304 may include symbols, markings, shapes, characters, text, or other elements that designate, annotate, or otherwise call out particular aspects of the architectural layout. For example, the set of architectural objects 304 can include a line, an arc, a shape, a symbol, a wireframe, a plane, a surface, a face, or a point-cloud. For instance, the set of architectural objects may include a diagonal line to indicate a door, a thick line to indicate a wall, an elongated rectangle to indicate a window, and the like. In embodiments the set of architectural objects 304 may represent, symbolize or indicate a set of architectural features of the building or structure depicted by the architectural layout. As examples, the architectural features may include doors, windows, walls, stairs, appliances, furnishings, and other physical characteristics of the building or structure.

In embodiments, the architectural object ingestion system 310 may be configured to ingest the set of architectural objects 304 from the data source 302. Ingesting the set of architectural objects 304 may include using a software program to detect/collect the architectural objects 304 from a digital blueprint/model, a scanner to digitize a printed blueprint, software to capture data from a constructed model or the like. Detecting may include sensing, identifying, discovering, recognizing, or distinguishing the set of architectural objects (see e.g., operation 312). In certain embodiments, the set of architectural objects may be detected using one or more object recognition techniques. More particularly, the object recognition technique may include an algorithm or method configured to identify elements of a still image, video, architectural layout, or other visual representation. The object recognition technique may employ one or more image analysis strategies such as edge detection, gradient matching, ridge detection, blob detection, interpretation trees, grayscale matching, SIFT (scale-invariant feature transform), SURF (Speeded Up Robust Features) and the like.

In embodiments, aspects of the ingestion system 310 may be configured to transform data. Transforming may include converting, translating, or editing data. For instance, in embodiments the ingestion system 310 may import a printed copy of a blueprint. The printed blueprint may include a number of inconsistencies such as varying line thickness, curved lines, smudged text and the like. Generally, ingesting can include gathering, collecting, aggregating, importing, processing, or otherwise obtaining data. For example, ingesting can include acquiring/receiving a computer file including an architectural layout, or creating a digital representation of a drawn blueprint (e.g., scanning). In embodiments, the ingestion system 310 may be configured to validate the data designated for ingestion or categorize/sort/prioritize/rearrange the data based on a variety of factors including the format, size, relevancy, date, and other properties. Accordingly, aspects of the ingestion system 310 may be configured to reconstruct the blueprint by tracing over the lines and formatting the text of the blueprint to improve the precision, accuracy, neatness and consistency of the blueprint. Other methods and processes for data transformation are also possible.

In certain embodiments, the ingestion system 310 may be configured to ingest the architectural layout from a physical model or structure of a building. For example, in embodiments the ingestion system 310 may be configured to use image capture techniques to analyze a constructed scale model of the architectural layout and identify the architectural objects and corresponding architectural features. Similarly, in certain embodiments the ingestion system 310 may be configured to capture images of a building (e.g., the building may be fully constructed or partially constructed), and transform the architectural data gathered from the images into an architectural layout. Other methods and processes for ingesting and transforming the architectural layout and architectural objects are also possible.

In embodiments, the architectural object ingestion system 310 may include an architectural object analysis subsystem 311. The architectural object analysis subsystem may be configured to analyze the set of architectural objects. Generally, analyzing the set of architectural objects may include processing, validating, authenticating, or evaluating the set of architectural objects. In embodiments, analyzing the set of architectural objects may include detecting the set of architectural objects (at operation 312), identifying a subset of the set of objects (at operation 313), and extracting a set of object data from the subset of the architectural objects (at operation 314). Other methodologies of analyzing data (e.g., the set of architectural objects) are also possible including those described herein.

At operation 313 the architectural object ingestion system 310 may be configured to identify a subset of the architectural objects. The subset of the architectural objects may include a group of architectural objects that correspond with a subset of the architectural features. More particularly, the subset of the architectural objects may be at least a portion of the set of architectural objects that indicates an impact on energy distribution (e.g., exterior walls, interior walls, windows, doors, floors, ceilings). In embodiments, the subset of the architectural objects may be identified using a reference database. Generally, the reference database may include an organized archive of information including data regarding the architectural objects. The data in the reference database may be either structured or unstructured, and organized using one or more of a number of file formats (e.g., plain text, XML, SQL, Perl DBM). In embodiments, the reference data may be used to facilitate identification of the subset of the set of architectural objects. More particularly, the set of architectural objects detected using the object recognition technique may be compared to the archived information in the database to discern walls, windows, doors, and other architectural objects and features.

In embodiments, the reference database may include a set of training images (e.g., reference images containing objects to serve as a comparison for the architectural objects) to facilitate identification of the set of architectural objects. The training images may contain images of the symbols, shapes, words, and characters used in the architectural layout to represent the architectural features (e.g., a double-thick wall for a window, slanted line for a door, elongated rectangle for a window). Accordingly, the object recognition technique may use the training images to extract feature descriptions (e.g., interesting or distinguishing points for each shape or symbol) from each image, and compare these feature descriptions to the shapes and objects present in the architectural layout. Based on the position, size, orientation, scale, or Euclidean distance between respective points of a given object, the object recognition technique may detect the set of architectural objects of the architectural layout. In embodiments, a substantial similarity factor may be used (e.g., elements substantially similar within a threshold such as within 10% of both position and size). Other multidimensional object recognition techniques are also possible.

Consider the following example. The training images may contain an image of an equilateral quadrilateral with four circles located in a 2×2 pattern on its surface (e.g., a representation of a stove/oven). Accordingly, the object recognition technique may analyze the quadrilateral, determine the ratio of the lengths of its sides, the spacing of each circle relative to the other circles and the sides of the quadrilateral, and other information such as the color, size, and orientation of the object. The object recognition technique may then compare the gathered information with the architectural layout to locate and identify an object matching the feature description of the quadrilateral. In embodiments, the object recognition technique may include using a predetermined tolerance threshold to facilitate identification of the architectural objects. The tolerance threshold may include a specification, criterion or guideline that quantitatively or qualitatively designates a range of acceptable conditions for each attribute of the feature description (e.g., the sides of the quadrilateral may not be equilateral, but fall within a 10% tolerance threshold). In embodiments, objects in the architectural layout that match the feature descriptions of one or more images in the training images (e.g., that achieve the tolerance threshold) may be selected as part of the subset of the set of architectural objects.

At operation 314 the architectural object ingestion system 310 may include extracting a set of object data from the subset of the set of architectural objects. Generally, extracting the set of object data from the subset of the architectural objects may include identifying, evaluating, filtering, measuring, calculating, or performing another computational process to obtain or pull the set of object data from the architectural object. The set of object data may include information describing the size, shape, position, and other characteristics of the subset of architectural features. For instance, in embodiments, the set of object data may include coordinates of line start/endpoints, the thickness or length of certain lines, and the like. In embodiments, the set of object data may include the lines, shapes, or three-dimensional entities themselves (e.g., the set of object data may include lines, words or symbols that represent walls/doors, windows, or other architectural features of the architectural layout).

In embodiments, extracting the set of object data may include generating a set of custom entities based on the characteristics of the subset of architectural features. The custom entities may include custom symbols, formatting, coordinates, a binary representation, or metadata that represents the size, shape, position, and other properties of the subset of architectural features. For example, in certain embodiments the architectural object ingestion system 310 may ingest an architectural layout in which interior walls are represented by dashed lines, exterior walls are represented by thin solid lines, and doors are represented by arced lines. Accordingly, generating the set of custom entities may include establishing and assigning standardized symbols for the architectural objects of the architectural layout. For example, the set of custom entities may include solid lines for interior walls, double thickness solid lines for exterior walls, and diagonal lines for doors. In certain embodiments, the set of custom entities may be consistent across multiple architectural layouts. Other custom entities and methods of generating custom entities are also possible.

At operation 315 the architectural object ingestion system 310 may be configured to map the set of architectural objects to the set of object data. Generally, mapping the set of architectural objects to the set of object data may include correlating the set of architectural objects with the set of object data. Mapping can include tracing/copying (e.g., to create new), computing (e.g., calculating a data set), detecting (e.g., sensing obtainable information), authenticating (e.g., verifying/checking), arranging (e.g., aligning), manipulating (e.g., adjusting), or normalizing existing/ingested objects. The set of object data may correspond with a subset of the set of architectural features (e.g., at least a portion of the set of architectural features such as walls but not appliances). For example, the set of object data may include a set of custom entities which have coordinates of a set of rectangular parallelepipeds (e.g., vertices). Coordinates of the set of rectangular parallelepipeds may be configured to represent a set of walls of the architectural layout. Other shapes, lines, symbols, etc. may be used with respect to walls, doors, windows, etc. For instance, mapping may transform/translate a first format into a second format.

Aspects of the present disclosure are directed toward determining a set of spatial zones of the architectural layout. The set of spatial zones may include two-dimensional, three-dimensional, or multidimensional rooms, areas, or other portions of space within a building or other structure. In embodiments, the set of spatial zones may be separated by walls, doors, floors/ceilings, or partitions from other spatial zones. As described herein, the design-model management system 300 may include a spatial zone determination system 320 configured to determine the set of spatial zones of the architectural layout.

In embodiments, an architectural object normalization subsystem 321 may be included in the spatial zone determination system 320. In certain embodiments, the architectural object normalization subsystem 321 may be included in the architectural object ingestion system 310 or as its own system (e.g., between 310 and 320). Aspects of the present disclosure relate to the recognition that, in certain situations, the architectural objects ingested by the architectural object ingestion system 310 may adhere to one or more of a number of formatting styles and various different standardization criterion. Normalization of these varying formats and standardization criterion may be associated with benefits including simplified determination of the spatial zones. Accordingly, the architectural object normalization subsystem may be configured to modify, edit, trace, or standardize the set of architectural objects to facilitate determination of the set of spatial zones. More particularly, normalizing the set of architectural objects may include arranging, merging, editing or assigning one or more architectural objects of the set of architectural objects. Other methods for normalizing the set of architectural objects are also possible.

At operation 322 the architectural object normalization subsystem 321 may include arranging an (ingested) object based on a positioning element. The (ingested) object can include an architectural object of the set of architectural objects; in certain embodiments, it may have been ingested by the architectural object ingestion system 310. As described herein, the (ingested) object may represent an architectural feature of the architectural layout. As an example, the (ingested) object may include a straight line (e.g., a symbol that may represent a wall) a circle (e.g., a symbol that may represent a table), an elongated rectangle (e.g., a symbol that may represent a window) or the like. In embodiments, the (ingested) object may be associated with a positioning element. The positioning element may include data or information that indicates the location (e.g., level, layer) of one or more objects in the architectural layout. The positioning element may indicate the location of the (ingested) object in absolute terms (e.g., Cartesian coordinates, elevation), in relative terms (e.g., based on the position of other fixed elements of the architectural layout) or both and can also be utilized in three-dimensions.

Based on the positioning element, at operation 322 the architectural object normalization subsystem 321 may include arranging the (ingested) object. Arranging the (ingested) object may include modifying the position, orientation, elevation, or alignment of the (ingested) object. Consider the following example. The alignment of one or more architectural objects in the architectural layout may be disrupted due to different formatting styles, drafting criterion, and the like. For instance, lines representing walls (e.g., interior or exterior walls) of the architectural layout may have shifted such that they do not meet at their endpoints, leaving gaps in the structure of the building. Accordingly, at operation 322 arranging the (ingested) objects may include aligning the walls based on the positioning element for each wall such that they form a closed structure. Other methods of arranging the (ingested) objects are also possible.

At operation 323 the architectural object normalization subsystem 321 may be configured to merge a plurality of (ingested) objects into a single (ingested) object. The plurality of (ingested) objects may include one or more architectural objects obtained by the architectural object ingestion system 310. Generally, merging the plurality of (ingested) objects into a single (ingested) object may include combining, synthesizing, amalgamating, connecting, concatenating, fusing or consolidating multiple (ingested) objects into a single (ingested) object. More particularly, merging one or more (ingested) objects into a single object may include removing any lines or markings in the architectural layout that may have indicated that the objects were separate, repositioning the objects such that they interface with one another, and regrouping/classifying the two objects as a single object.

Consider the following example. In embodiments, the architectural layout may include an isometric drawing of the exterior face of a house. The front of the house may include a large glass window that extends from the first floor to the second floor. When originally imported by the architectural object ingestion system 310, the window may have been ingested in multiple parts, resulting in two (ingested) objects (e.g., as the window extends over two floors, it may have been recognized as two separate windows; one on the first floor and one on the second floor). Accordingly, in certain embodiments, the architectural object normalization subsystem 321 may be configured to merge the two (ingested) objects into a single (ingested) object. Other methods of merging one or more (ingested) objects are also possible.

At operation 324 the architectural object normalization subsystem 321 may be configured to edit an architectural object for geometrical accuracy. Aspects of the present disclosure relate to the recognition that in certain situations, the (ingested) objects may not be geometrically represented precisely as intended (e.g., lines may be drawn at a slight angle rather than perfectly straight, the sides of shapes intended to be equilateral may differ slightly in length). Accordingly, aspects of the architectural object editing operation 324 may be configured to modify, edit, correct, or refine the geometrical accuracy of one or more geometrical objects. Generally, geometrical accuracy may include a quantitative or qualitative indication of the degree of precision of an (ingested) object. In certain embodiments, the geometrical accuracy of one or more (ingested) objects may be quantitatively evaluated (e.g., assigned a geometrical accuracy score) and compared to a standard criterion or threshold value. (Ingested) objects with a geometrical accuracy score below the threshold value may be corrected or refined to more accurately represent the architectural object. For example, in certain embodiments, a certain (ingested) object may include a quadrilateral resembling a square; however, the angles of the corners may not be precise right angles (e.g., one corner may be 88 degrees while another corner may be 92 degrees). Accordingly, in embodiments the corners of the quadrilateral may be adjusted to be 90 degrees. In embodiments, the architectural object editing operation 324 may be configured to request the confirmation of a user or administrator before editing the geometry of the architectural object. Other methods of editing the geometrical accuracy of architectural objects are also possible.

At operation 325 the architectural object normalization subsystem 321 may be configured to assign a first (ingested) object to correlate with a second (ingested) object. The first (ingested) object may represent a first architectural feature of the architectural layout, and the second (ingested) object may represent a second architectural feature of the architectural layout. Assigning a first (ingested) object to a second (ingested) object may include grouping, designating, allocating, appointing, or linking the first object with the second object. For example, in embodiments a first (ingested) object representing a door or window may be assigned a second (ingested) object representing a wall. Assigning a first (ingested) object to correlate with a second (ingested) object may provide benefits associated with ease of object management (e.g., manipulation of objects within the architectural layout) and energy distribution efficiency (e.g., for thermal-load analysis purposes it may be desirable to calculate thermal loads for a single wall-window structure rather than for two independent objects).

As described herein, in certain embodiments, the spatial zone determination system 320 may be configured to determine a set of spatial zones of the architectural layout. Determining the set of spatial zones may be based on the ingestion of the set of architectural objects. In embodiments, normalization of the set of architectural objects by the architectural object normalization subsystem 321 may facilitate determination of the set of spatial zones. Generally, the set of spatial zones may include rooms, areas, sections, or other portions of space within a building or other structure. The set of spatial zones may be two-dimensional, three-dimensional, or multidimensional. In embodiments, the set of spatial ones may be separated by walls, doors, or other physical partitions from other spatial zones. In embodiments, the set of spatial zones may not be separated by a physical barrier, but rather an elevation change (e.g., staircase, sunken room) or by utility (e.g., kitchen, bedroom, bathroom).

At operation 326, the spatial zone determination system 320 may be configured to determine that ingestion of the set of architectural objects indicates a set of polytopes. A polytope (e.g., a geometric object with flat sides) may exist in any general number of dimensions (e.g., two-dimensional, three-dimensional, n-dimensional). In embodiments, determining the set of polytopes may be based on the set of object data. At operation 326, the spatial zone determination system may be configured to analyze the set of object data to ascertain a set of vertices of the set of polytopes. Generally, the set of vertices may include intersections of two or more lines or planes in a two-dimensional figure, and points common to three or more planes in a three-dimensional figure. For example, operation 326 may analyze the set of object data and ascertain a set of vertices that indicate spots where a set of walls end. The arrangement of the set of walls may be such that an open space is enclosed in between one or more walls. In embodiments, the enclosed space may be resolved as a polytope of the set of polytopes.

At operation 327 the spatial zone determination system 320 may be configured to determine the set of spatial zones of the architectural layout. As described herein, in embodiments the set of spatial zones may include rooms, areas, sections, or other portions of space within a building or other structure. In embodiments, determination of the set of spatial zones may be based on the set of polytopes established at operation 327.

At operation 329 the spatial zone determination system 320 may be configured to determine a first spatial zone identifier for a first spatial zone and a second spatial zone identifer for a second spatial zone. Generally, the spatial zone identifiers may include words, images, characters, names, or other annotations that designate a particular spatial zone of the set of spatial zones. For instance, the spatial zone identifiers may be names that indicate particular rooms corresponding to one or more spatial zones (e.g., "bathroom," "kitchen"). In embodiments, the spatial zone identifiers may be determined based on a spatial zone identifier relationship. The spatial zone identifier relationship may be a link, connection, or other correlation that relates a particular area of the architectural layout with one or more spatial zones. For instance, in embodiments the spatial zone identifier relationship may be based on the position (e.g., expressed in Cartesian coordinates) and size of a particular area on the architectural layout in relation to one or more spatial zones.

More particularly, the spatial zone identification (ID) establishment operation 329 may be configured to determine that a first area on the architectural layout is a similar size and shape (e.g., achieves a geometry threshold) in comparison to a spatial zone of the set of spatial zones, and also that the two regions share similar position coordinates (e.g., achieves a position threshold.) Accordingly, a first spatial identifier may be determined for the first spatial zone. As described herein, the spatial zone identifier may include a word, image, character, name, or other annotation. In embodiments, the spatial zone identifier may be determined based on a label or annotation present in the architectural layout. For example, a particular area on the architectural layout may be labeled as "living room," and so the corresponding spatial zone may also be labeled "living room." In response to determining the spatial zone identifiers, the spatial zone ID establishment operation 329 may be configured to establish the design-model of the architectural layout and include the spatial zone identifiers. Put differently, the spatial zone ID establishment operation 329 may be configured to assign the spatial zone identifiers to the corresponding spatial zones of the architectural layout.

Aspects of the present disclosure relate to the recognition that, in certain situations, a label or room name may not be present for one or more areas of the architectural layout. Accordingly, aspects of the present disclosure are directed toward analyzing the architectural layout and generating an original spatial zone identifier for the corresponding spatial zone. In embodiments, generating the spatial zone identifier may include analyzing the location of the room relative to other rooms, as well as the size, shape, and contents of the room, and generating a spatial zone identifier based on these factors. As an example, a room that contains a toilet and a sink may have a high likelihood of being a bathroom, while a room that contains cupboards, a countertop, microwave, sink, and oven may have a high likelihood of being a kitchen (e.g., based on a confidence score such as 85%). Accordingly, the spatial zone ID establishment operation 329 may be configured to generate spatial identifiers of "Bathroom," and "Kitchen," for these rooms, respectively. Similarly, a small room located near the main entrance to a house may have a high likelihood of being a closet, and so the spatial zone ID establishment operation 329 may generate and assign a spatial zone identifier of "Entryway Closet" for the corresponding spatial zone. In certain embodiments, the spatial zone ID establishment operation 329 may be configured to access a database of architectural layouts and employ machine learning techniques to develop a table or model of room characteristics and associated probabilities for candidate spatial zone identifiers. Other methods of determining and generating spatial room identifiers are also possible.

At operation 330 the spatial zone determination system 321 may be configured to convert one or more spatial zones based on a threshold size factor. In embodiments, converting the spatial zones may include merging a plurality of spatial zones into a single spatial zone. In certain embodiments, converting the spatial zones may include dividing a single spatial zone into a plurality of spatial zones. As described herein, converting the spatial zones may be based on a threshold size factor. The threshold size factor may be a specification, criterion or guideline that quantitatively or qualitatively designates a preferable size for the set of spatial zones. In embodiments, the threshold size factor may be expressed in relative terms as a ratio or percentage of the total area (e.g., or volume) of the architectural layout. The threshold size factor may also be expressed in absolute terms as a specified area or volume value. In embodiments, the threshold size factor may be determined by a user (e.g., the user may specify a desirable size range for the spatial zones).

In embodiments, the threshold size factor may include an upper boundary and a lower boundary, such that spatial zones that fall within the range may be considered to be of satisfactory size, spatial zones that fail to achieve the lower boundary may be considered candidates for merge, and spatial zones that exceed the upper boundary may be considered candidates for division. In certain embodiments, the threshold size factor may be computed based on the size or scope of the architectural layout. For example, the upper boundary may be determined to a ratio or portion of the entire area or volume of the architectural layout (e.g., ⅕ the size of the total area) and the lower boundary may be expressed as a ratio of the largest spatial zone (e.g., ¼ the size of the largest spatial zone.) Other methods of determining the threshold size factor are also possible.

Consider the following example. An architectural layout for a home may be composed of 10 individual spatial zones, comprising 22% (e.g., first floor living room), 15% (basement living room), 14% (kitchen), 11% (master bedroom), 10% (dining room), 7% (first bedroom), 7% (second bedroom), 6% (study), 5% (master bathroom), 3% (secondary bathroom) of the total area of the architectural layout, respectively. As described herein, the threshold size factor may have an upper boundary of 20% and a lower boundary of 6%. Accordingly, the spatial zone conversion operation 330 may identify the first floor living room as a candidate for division (e.g., it exceeds the upper boundary of the threshold size factor), and the master bathroom and secondary bathroom as candidates for merge (e.g., they fail to achieve the lower boundary of the threshold size factor).

Division and merging of the spatial zones may be executed in one of a number of ways. In embodiments, spatial zones that exceed the upper boundary of the threshold size factor may be divided evenly into two or more spatial zones based on position (e.g., "north half," and "south half"). In embodiments, division of a spatial zone may be based on the utility or purpose of one or more portions of the spatial zone (e.g., "TV Area," and "Billiard Area.") In certain embodiments, a portion of a spatial zone that exceeds the upper boundary may be subtracted and added to a nearby spatial zone. Merging the spatial zones may also be based on position or utility/purpose. For instance, referring to the example above, the master bathroom may be merged with the adjacent master bedroom to create a single, larger spatial zone. Other methods of converting the spatial zones are also possible.

Aspects of the present disclosure are directed toward establishing a design-model of the architectural layout. The design-model of the architectural layout may include a graphical (e.g., blueprint, computer generated model), analytical (e.g., computational, scalability, device-selection-type), or textual (e.g., written language description, binary code, programming code) representation of one or more modifications to the architectural layout. In embodiments, the design-model of the architectural layout may include blueprints for a heating, ventilation, and air conditioning (HVAC) system to be constructed in the building. As shown in FIG. 3, the design-model management system 300 may include a design-model establishment system 340 configured to generate a design-model (e.g., different from an operating/device-model in embodiments) for the architectural layout. More particularly, establishing the design-model may include establishing a group of polytopes that indicate the set of spatial zones. Establishing the group of polytopes may be based on a set of polytopes determined previously. The group of polytopes may subsequently be presented, displayed, printed, or otherwise output.

As described herein, in certain embodiments the design-model for the architectural layout may include a HVAC design-model. Accordingly, at operation 341 the design-model establishment system 340 may be configured to calculate a thermal load associated with the architectural layout. The thermal load may include a computation of the heat flow and energy distribution of the various systems at work in the building represented by the architectural layout. Put differently, the thermal load be include the amount of energy needed to be added or removed from a given space by the HVAC system to maintain a comfortable environment. For instance, the thermal load may include external thermal loads such as the heat from the sun and the earth, as well as internal thermal loads such as the heat from lights, human bodies, and ovens. Calculating the thermal load for the architectural layout may include using one or more thermal analysis techniques such as DEA (dielectric thermal analysis), DTA (differential thermal analysis), LFA (laser flash analysis), TOA (thermo optical analysis) and the like to generate a comprehensive model to account for the heat flow into and out of the building.

At operation 342 the design model establishment system 340 may be configured to generate a thermal system-design associated with the architectural layout (e.g., for energy distribution efficiency—air/radiant/hydronic distribution of energy/power to satisfy a thermal load). In embodiments, the thermal system-design may be generated based on the thermal load calculated by the thermal load calculation operation 341. Generally, the thermal system design may include an infrastructure of heating, ventilation, cooling and air conditioning equipment designed to manage the thermal load of the building. For instance, the thermal design-system may include air conditioners, water heaters, ducts, heaters, pipes, ventilation, and other equipment used to manage the thermal load of the building. Based on the thermal system-design generated by the thermal system-design operation 342, the bill of materials generation model 343 may be configured to generate a calculated cost for the equipment used in the thermal system-design. In embodiments, the bill of materials may include an individual breakdown of the components utilized in the thermal system design and a range of prices for each component. In certain embodiments, the bill of materials may include a suggested vendor for each component of the thermal system-design. At operation 344, the design-model establishment system 340 may be configured to output the thermal load, thermal system design, and bill of materials. Generally, outputting may include providing, displaying, rendering, or supplying the thermal load, thermal system design, and bill of materials to a user or administrator for subsequent processing.

Figure 4:
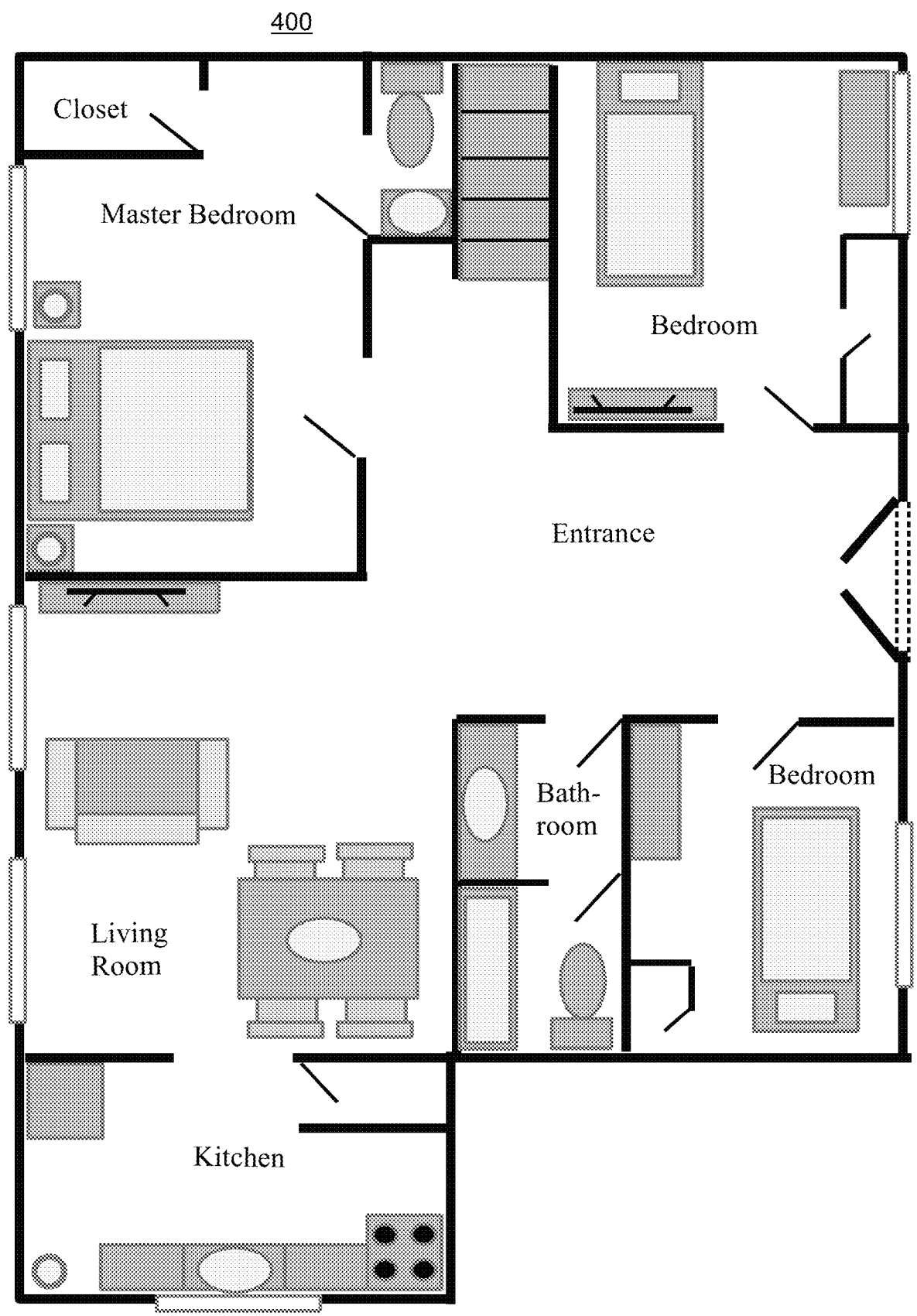
FIG. 4 depicts an example architectural layout of a building, according to embodiments.

FIG. 4 depicts an example architectural layout 400 of a building, consistent with embodiments. As described herein, aspects of the present disclosure are directed toward ingesting a set of architectural objects which represent features of an architectural layout. Accordingly, the architectural layout 400 includes a set of architectural objects that may be ingested by the architectural object ingestion system 310 of FIG. 3. For example, the architectural layout 400 may represent the state of the architectural layout at or prior to ingestion by the architectural object ingestion system 310 of FIG. 3.

FIG. 5 depicts an example architectural layout 500 of a building in a first phase, consistent with embodiments. In embodiments, the first phase may correspond to the ingestion process that may be executed by the architectural object ingestion system 310 of FIG. 3. For example, the first phase may represent the architectural layout 400 during or after having undergone the ingestion process. Accordingly, the architectural objects (e.g., windows, walls, doors, stairs) of the first phase may be have been detected and identified by the architectural object ingestion system. For instance, the architectural objects may remain (or have been traced/translated) with respect to the architectural layout while other objects (e.g., tables, couches, beds) may be removed/modified (or not traced/translated).

Figure 6:
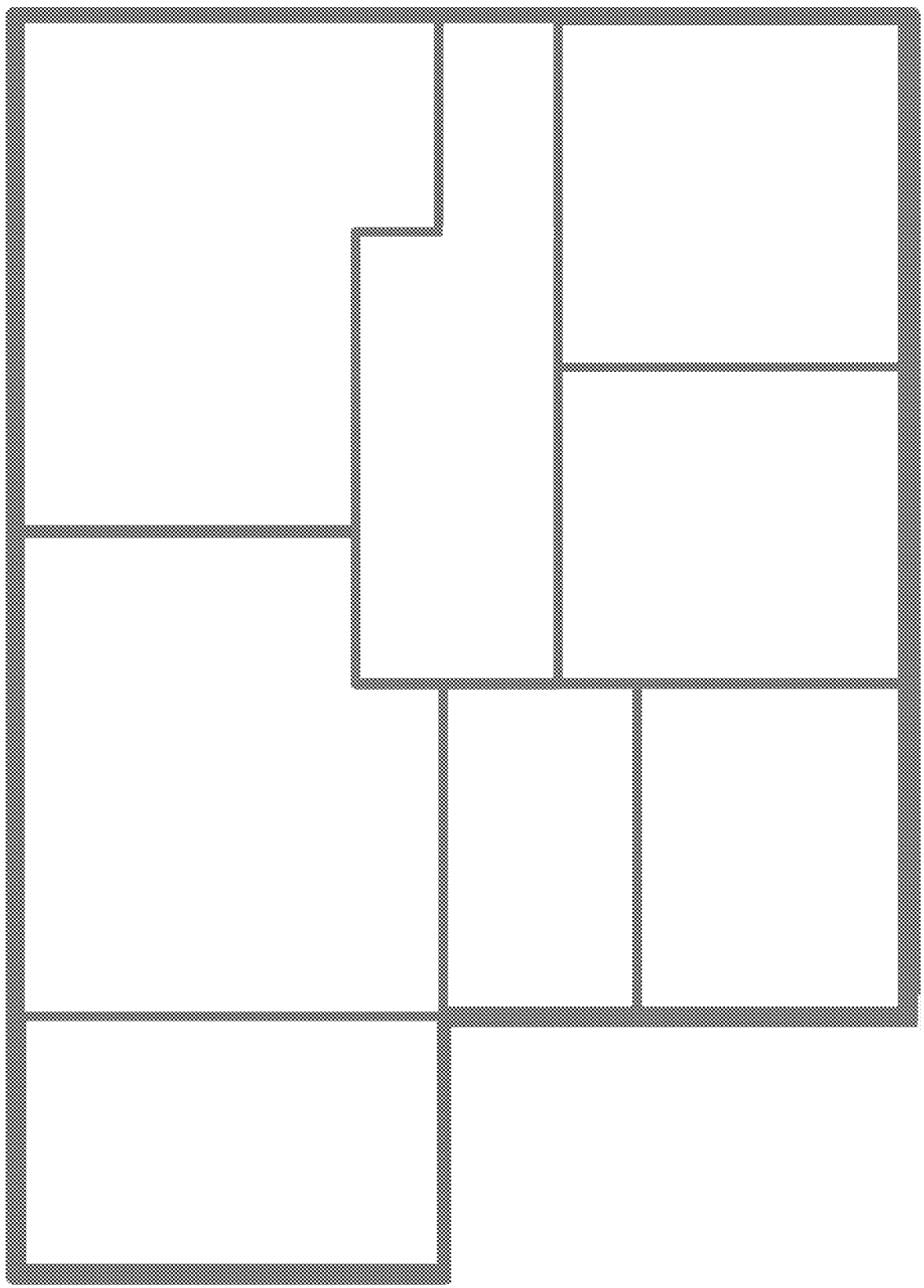
FIG. 6 depicts an example architectural layout of a building in a second phase, according to embodiments.

FIG. 6 depicts an example architectural layout 600 of a building in a second phase, consistent with embodiments. In embodiments, the second phase may correspond to the spatial zone determination process that may be executed by the spatial zone determination system 320. For example, the third phase may represent the first phase in response to the spatial zones having been determined. As described herein, in embodiments the spatial zones may include a set of polytopes or an array of points/coordinates which may be connected. In embodiments, the set of spatial zones of the second phase may correspond to the (location of the) rooms illustrated in the first phase. In embodiments, one or more rooms may have been converted (e.g., merged or divided) based on the threshold size factor (e.g., the closet of the first phase may have been merged with the master bedroom).

Figure 7:
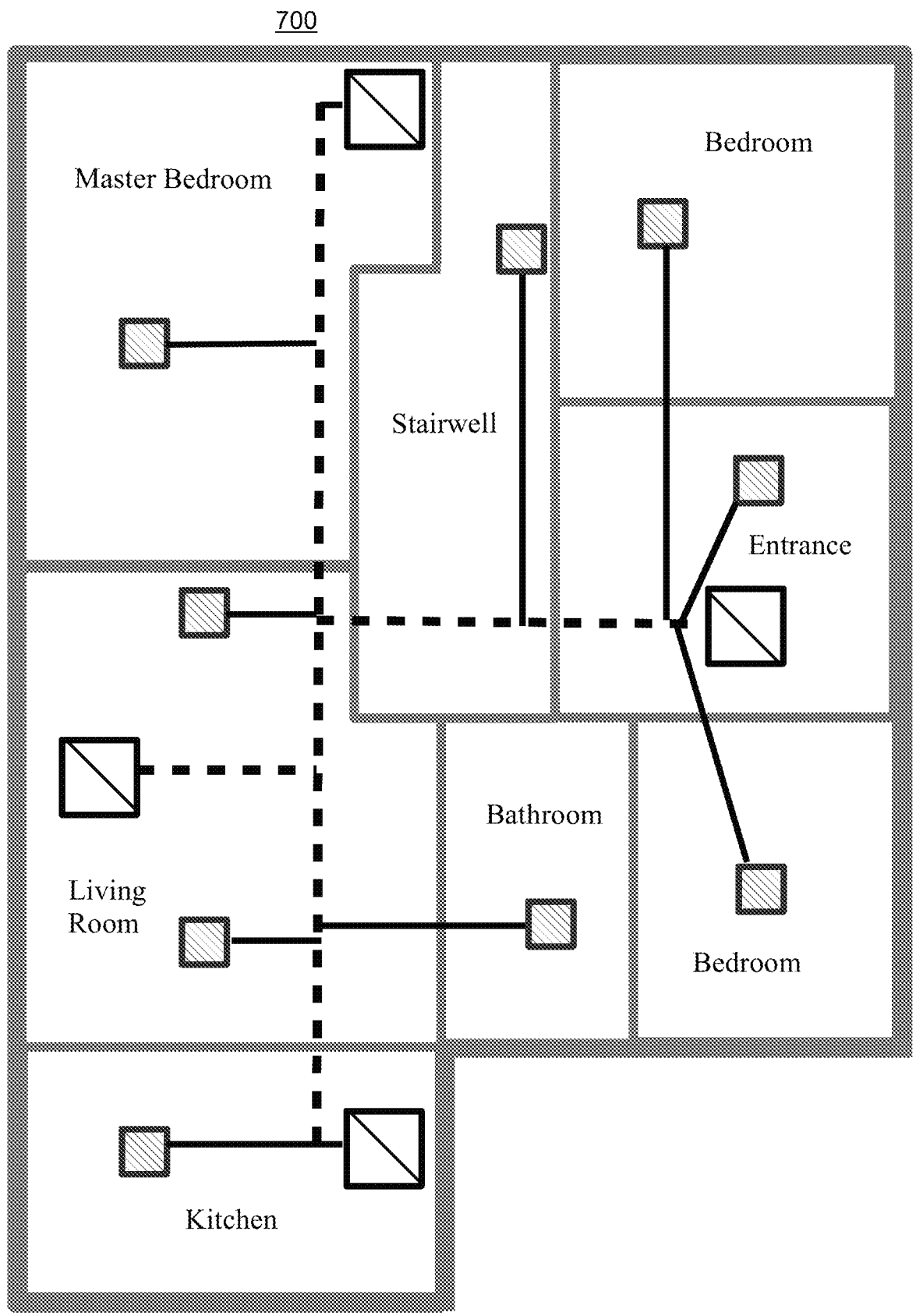
FIG. 7 depicts an example architectural layout of a building in a third phase, according to embodiments.

FIG. 7 depicts an example architectural layout 700 of a building in a third phase, consistent with embodiments. In embodiments, the third phase may include an example design-model for the building. As described herein, establishing the design-model may include generating a thermal-system design to manage the thermal load of the building. Accordingly, the third phase includes an example thermal system infrastructure of heating, ventilation, cooling and air conditioning equipment designed to manage the thermal load of the building. Further, as described herein establishing the design-model may include identifying spatial zone identifiers for one or more spatial zones of the architectural layout. The spatial zone identifiers may be generated based on room names previously included in the architectural layout, the use or purpose of the room, or determined using a database of architectural layouts.

In certain embodiments, establishing the design-model may be based in part on an exterior wall architectural object. The exterior wall architectural object may be included in the set of architectural objects, and may represent at least a portion of an exterior wall of the architectural layout. Generally, the exterior wall architectural object may include a wall or vertical structure having at least one surface that is outside of the building. In embodiments, the exterior wall object may be ingested with the set of architectural objects. In embodiments, the exterior wall object may be a custom entity generated based on the object data for the subset of architectural features. The exterior wall architectural object may be associated with a set of exterior wall data that indicates properties such as the insulation characteristics, thickness, structural attributes, degree of flammability, degree of permeability (e.g., to air, water) and the like. In embodiments, the exterior wall data may be used to generate the thermal-system design and establish the design-model for the architectural layout.

Figure 8:
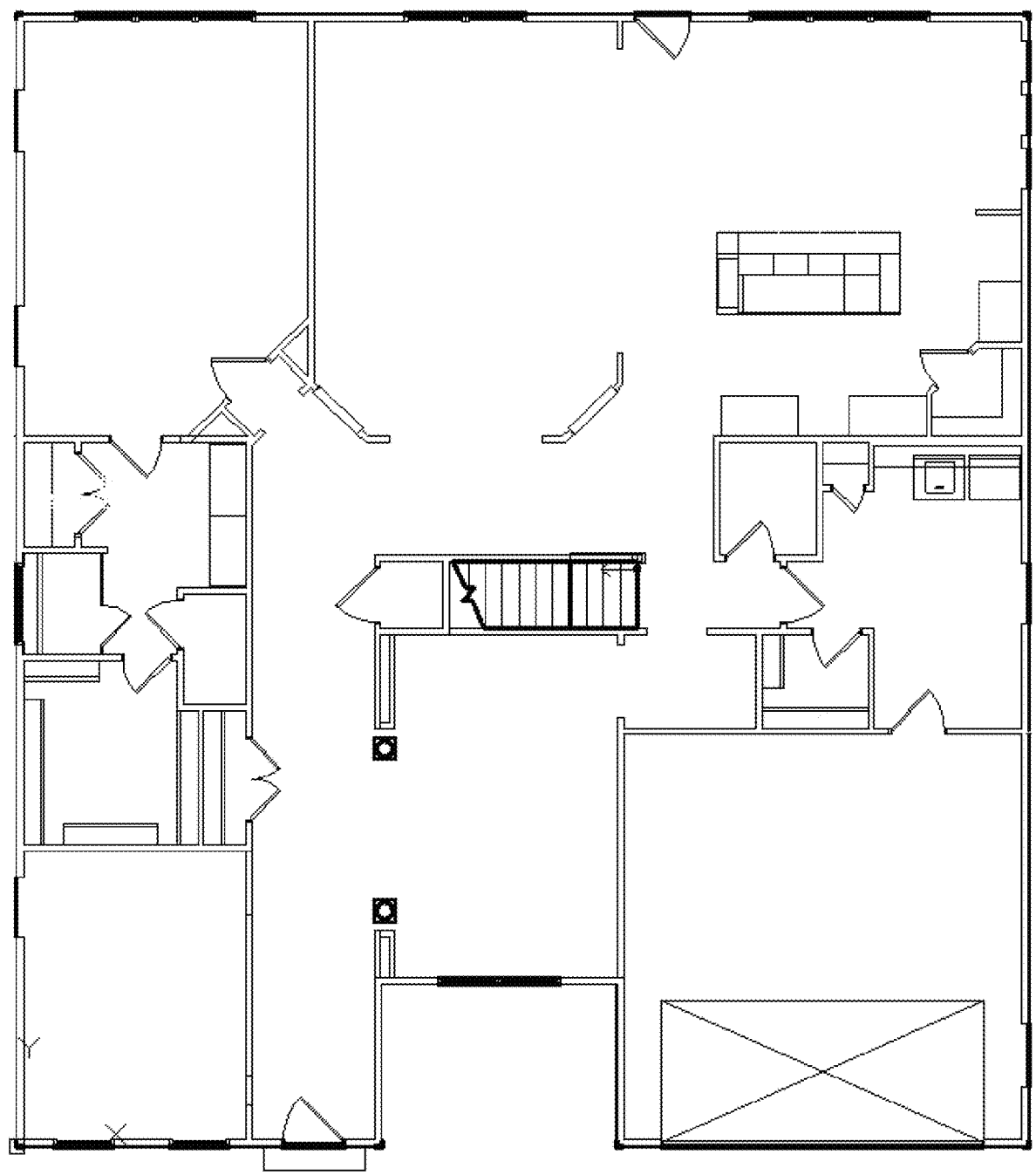
FIG. 8 depicts an example architectural layout of a building, according to embodiments.

FIG. 8 depicts an example architectural layout 800 of a building, consistent with embodiments. As described herein, the architectural layout 800 may include a set of architectural objects that represent a set of architectural features. The architectural layout 800 may represent the state of the architectural layout at or prior to ingestion by the architectural object ingestion system 310 of FIG. 3.

Figure 9:
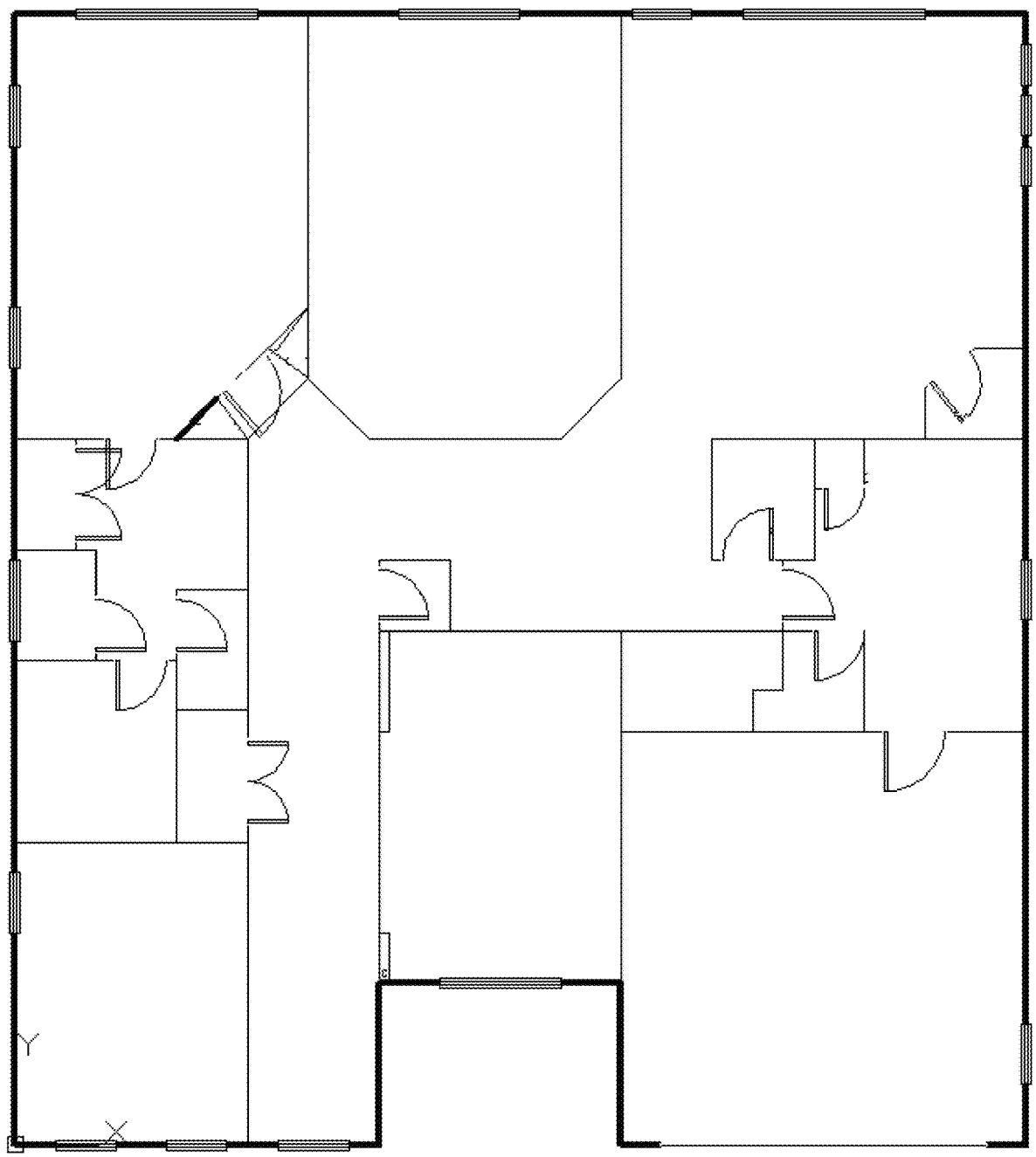
FIG. 9 depicts an example architectural layout of a building, according to embodiments.

FIG. 9 depicts an example architectural layout 900 of a building, consistent with embodiments. The architectural layout 900 may represent the state of the architectural layout 800 after having undergone the ingestion process. Accordingly, the architectural objects (e.g., windows, walls, doors, stairs) of the architectural layout 900 may be have been detected and identified by the architectural object ingestion system and may remain in the architectural layout while other objects (e.g., tables, couches, beds) may be removed.

Figure 10:
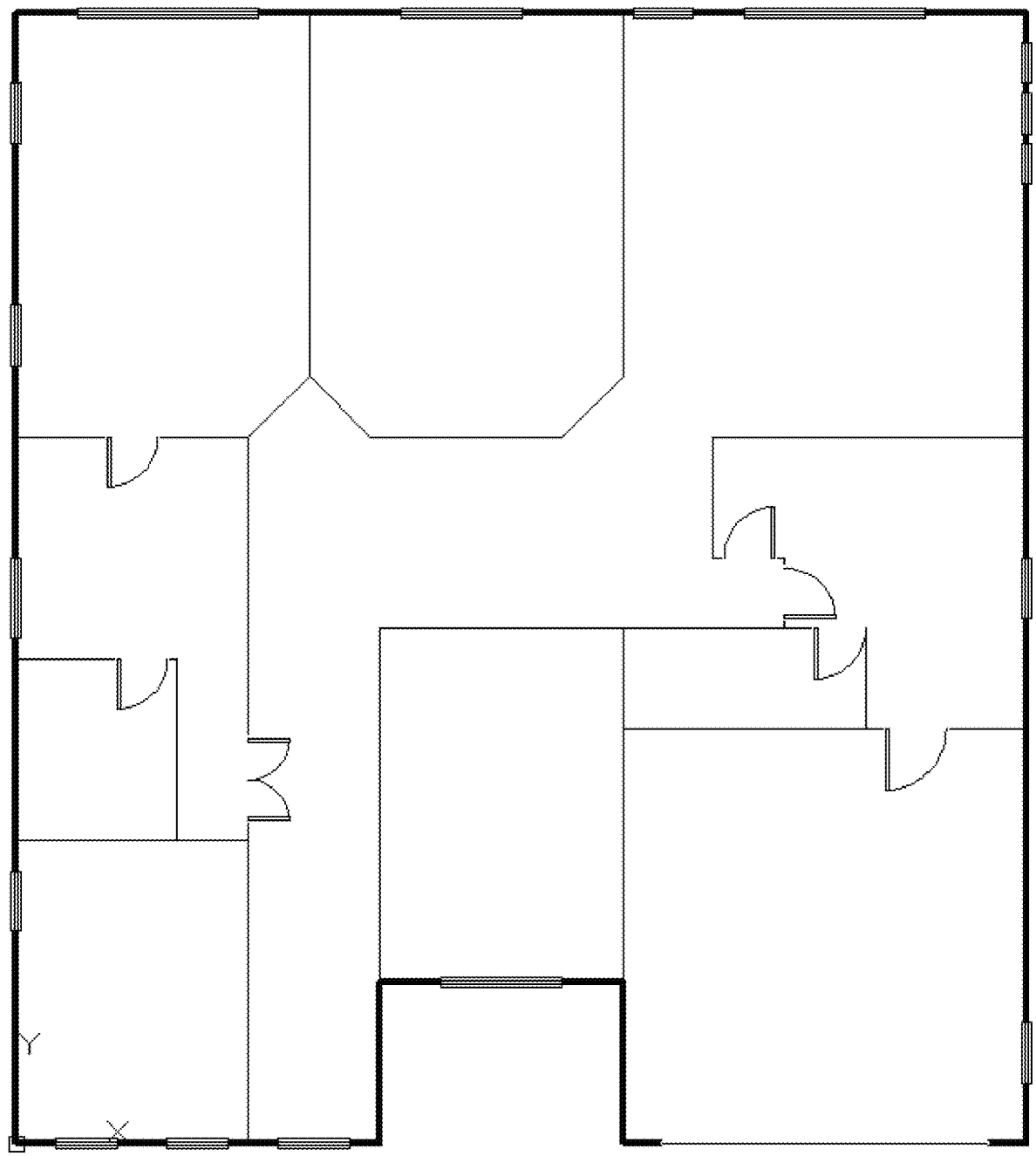
FIG. 10 depicts an example architectural layout of a building, according to embodiments.

FIG. 10 depicts an example architectural layout 1000 of a building, consistent with embodiments. In embodiments, the architectural layout 1000 may represent an architectural layout that has undergone the spatial zone determination and architectural object normalization processes of FIG. 3. Accordingly, spatial zones may be determined for the architectural layout 1000, and one or more spatial zones may be converted based on the threshold size factor (e.g., merged or divided). Additionally, the architectural objects (e.g., lines representing the walls, windows, and doors) of the architectural layout 1000 may be edited for positive impacts on geometrical accuracy. For example, lines and other marks may be removed from the architectural layout 1000, and shapes of the rooms may be revised. Other methods of revising the architectural layout 1000 are also possible.

Figure 11:
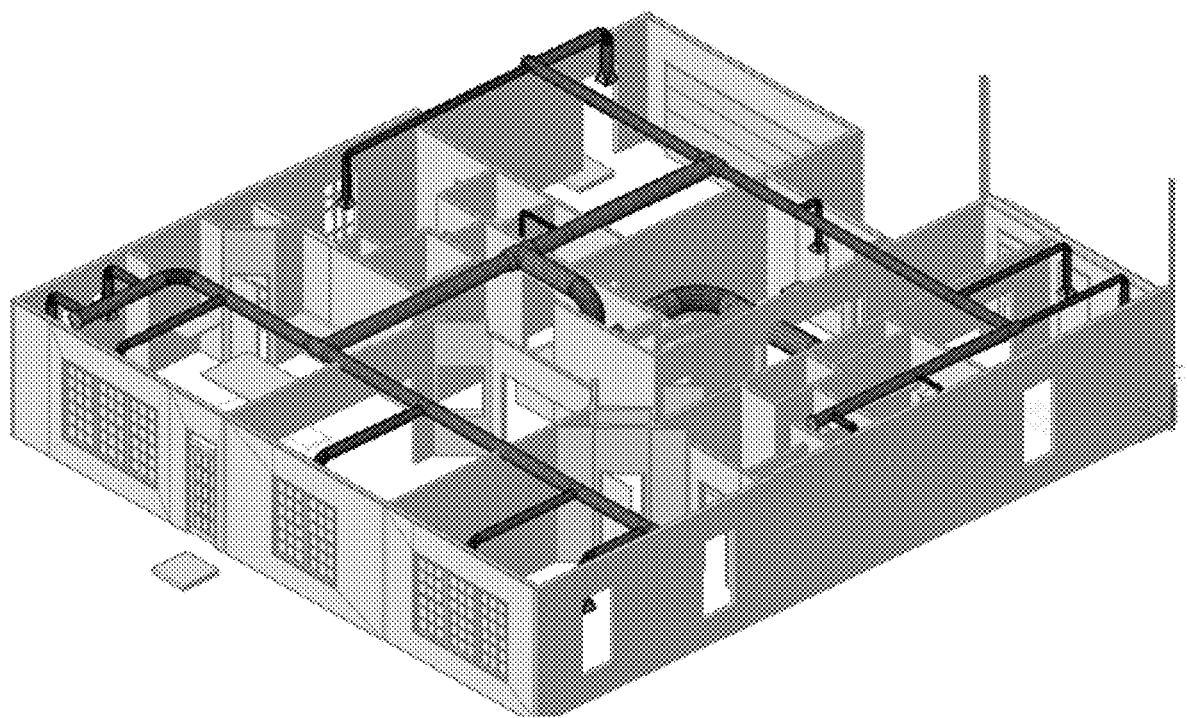
FIG. 11 depicts an example three-dimensional design-model, according to embodiments.

FIG. 11 depicts an example three-dimensional design-model 1100, consistent with embodiments. As described herein, establishing the design-model may include generating a thermal-system design to manage the thermal load of the building. Accordingly, the design-model 1100 includes an example thermal system infrastructure of heating, ventilation, cooling and air conditioning equipment (e.g., duct system objects) designed to manage the thermal load of the building. FIG. 11 may depict the design-model 1100 in a first view, displaying the thermal-system infrastructure and surrounding structural components.

Figure 12:
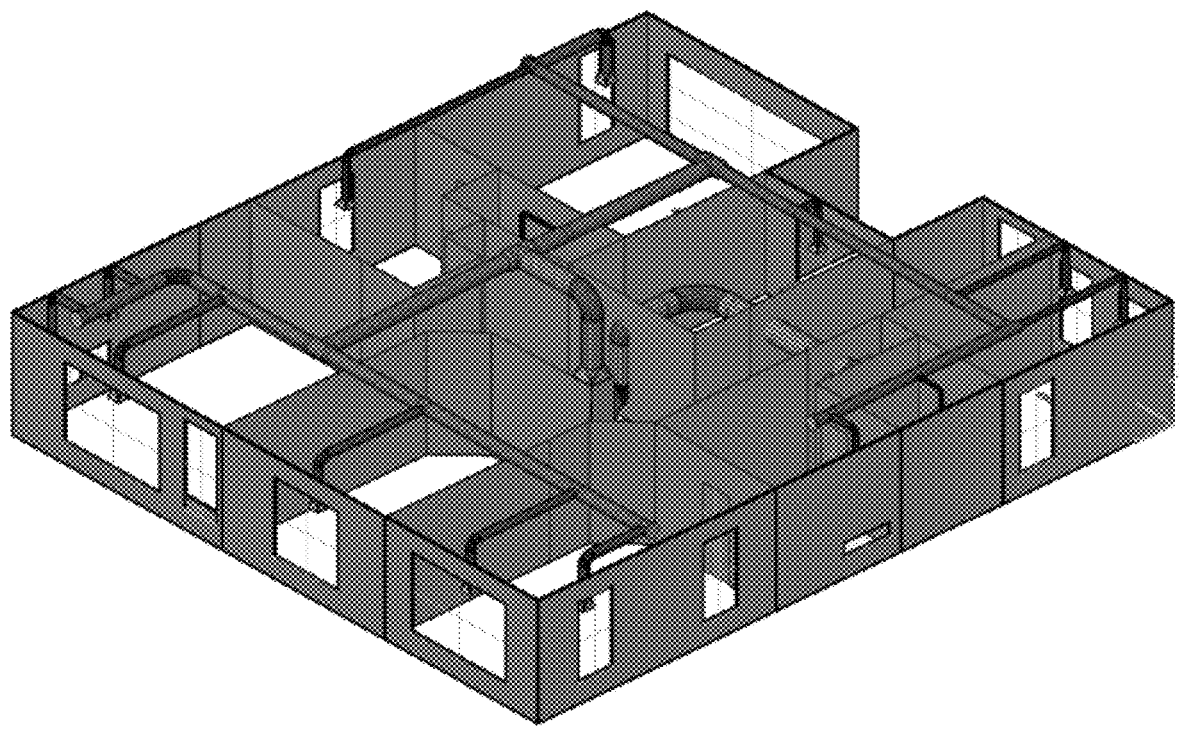
FIG. 12 depicts an example three-dimensional design-model, according to embodiments.

FIG. 12 depicts an example three-dimensional design model 1200, consistent with embodiments. FIG. 12 may depict the design model 1200 in a second view, displaying the thermal-system infrastructure, surrounding structural components, and architectural objects (e.g., rooms, windows, and doors) of the building. The thermal-system design may be used to model the heat flow and energy distribution of the building. Other thermal-design systems and methods of managing heat flow and energy distribution are also possible.

Figure 13:
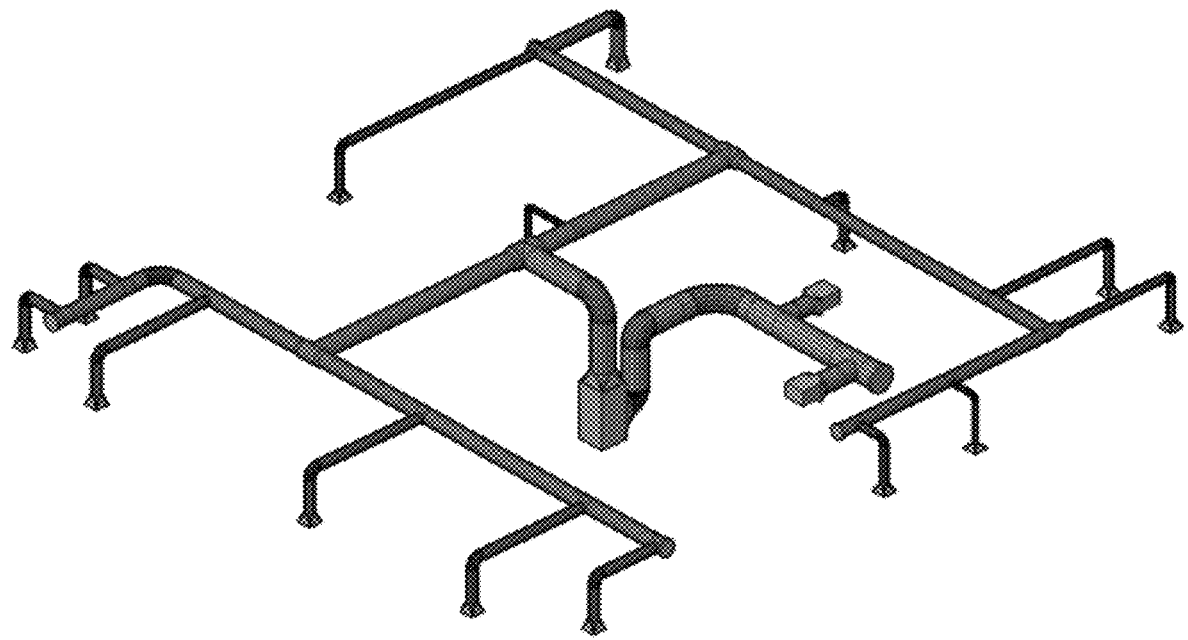
FIG. 13 depicts an example thermal-system design, according to embodiments.

FIG. 13 depicts an example thermal-system design 1300, consistent with embodiments. The thermal-system design 1300 may have an isolated view of the duct system objects and other heating, ventilation, cooling, and air conditioning equipment used in the first view of the three-dimensional design model 1100 and the second view of the three-dimensional design model 1200.

In addition to embodiments described above, other embodiments having fewer operational steps, more operational steps, or different operational steps are contemplated. Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method for design-model management associated with an architectural layout, the method comprising:

executing, by an automated design-model management application of a host device, an ingestion operation to input architectural data from a data source to the host device for processing, the architectural data including a set of architectural objects which represent a set of architectural features of the architectural layout, wherein inputting the architectural data from the data source includes extracting a set of object data from the set of architectural objects, the object data representing a subset of the set of architectural features;

in response to executing the ingestion operation to input the architectural data for processing, executing, by the design-model management application of the host device, a determining operation to determine a set of spatial zones based on the processing of the architectural data indicating a group of polytopes in the set of architectural objects, wherein determining the set of spatial zones includes processing the set of object data and computing the set of spatial zones based on the set of object data, and wherein determining the set of spatial zones further includes processing the set of architectural objects to determine a set of polytopes, comprising:

allocating, for the set of spatial zones, at least one architectural object coupled with the set of polytopes; and appending, for the design-model, at least one architectural object coupled with the group of polytopes; and in response to executing the determining operation to determine the set of spatial zones, executing, by the design-model management application of the host device, an establishing operation to establish, based on the set of spatial zones, a design-model of the architectural layout.

2. The method of claim 1, wherein:
the set of architectural features is selected from a first group consisting of at least one of: a wall, a window, a door, a stairwell, a ceiling, or a floor; and
the set of architectural objects is selected from a second group consisting of at least one of: a line, an arc, a shape, a symbol, a wireframe, a plane, a surface, a face, or a point-cloud.

3. The method of claim 1, wherein processing the architectural data includes:
analyzing the set of architectural objects; and
mapping the set of architectural objects to the set of object data.

4. The method of claim 3, wherein analyzing the set of architectural objects includes:
detecting, using an object recognition technique, the set of architectural objects;
identifying, using a reference database, a subset of the set of architectural objects which corresponds with the subset of the set of architectural features; and
extracting, from the subset of the set of architectural objects, the set of object data.

5. The method of claim 1, wherein determining the set of spatial zones includes:
processing the set of architectural objects to determine a set of polytopes.

6. The method of claim 1, further comprising:
normalizing, for utilization when determining the set of spatial zones, the set of architectural objects.

7. The method of claim 6, wherein normalizing the set of architectural objects includes at least one of a group consisting of:
arranging the architectural objects based on a positioning element;
merging the architectural objects;
editing, for geometrical accuracy, the architectural objects; or
assigning a first ingested object which represents a first architectural feature of the architectural layout to correlate with a second ingested object which represents a second architectural feature of the architectural layout.

8. The method of claim 1, further comprising:
determining, based on a spatial zone identifier relationship, a first spatial zone identifier for a first spatial zone and a second spatial zone identifier for a second spatial zone; and
establishing, in response to determining both the first spatial zone identifier and the second spatial zone identifier, the design-model having both the first spatial zone identifier and the second spatial zone identifier.

9. The method of claim 1, further comprising:
converting, based on a threshold size factor for a spatial zone, a plurality of spatial zones.

10. The method of claim 1, wherein establishing the design-model includes:
calculating a thermal load associated with the architectural layout;
generating a thermal system-design associated with the architectural layout;
generating a bill of materials for the thermal system-design; and
outputting the thermal load, the thermal system-design, and the bill of materials.

11. The method of claim 1, wherein the data source includes an architectural graphical representation, and wherein the design-model includes a heating, ventilation, and air conditioning (HVAC) design-model.

12. The method of claim 1, wherein:
the set of architectural objects includes an exterior wall architectural object which represents at least a portion of an exterior wall of the architectural layout;
at least a portion of the set of spatial zones correlate to the exterior wall object; and
the design-model includes a heating, ventilation, and air conditioning (HVAC) design-model.

13. The method of claim 1, further comprising:
metering use of the ingestion operation to input the architectural data for processing; and
generating an invoice based on the metered use.

14. A system for design-model management associated with an architectural layout, the system comprising:
a memory having a set of computer readable computer instructions, and a processor for executing the set of computer readable instructions, the set of computer readable instructions including:
executing, by an automated design-model management application of a host device, an ingestion operation to input architectural data from a data source to the host device for processing, the architectural data including a set of architectural objects which represent a set of architectural features of the architectural layout, wherein inputting the architectural data from the data source includes extracting a set of object data from the set of architectural objects, the object data representing a subset of the set of architectural features;
in response to executing the ingestion operation to input the architectural data for processing, executing, by the design-model management application of the host device, a determining operation to determine a set of spatial zones based on processing of the architectural data indicating a group of polytopes in the set of architectural objects, wherein determining the set of spatial zones includes processing the set of object data and computing the set of spatial zones based on the set of object data, and wherein determining the set of spatial zones further includes processing the set of architectural objects to determine a set of polytopes, comprising:
  allocating, for the set of spatial zones, at least one architectural object coupled with the set of polytopes; and
  appending, for the design-model, at least one architectural object coupled with the group of polytopes; and
in response to executing the determining operation to determine the set of spatial zones, executing, by the design-model management application of the host device, an establishing operation to establish, based on the set of spatial zones, a design-model of the architectural layout.

15. A computer program product for design-model management associated with an architectural layout, the computer program product comprising a computer readable storage medium having program instructions embodied therewith, wherein the computer readable storage medium is not a transitory signal per se, the program instructions executable by a processor to cause the processor to perform a method comprising:
  executing, by an automated design-model management application of a host device, an ingestion operation to input architectural data from a data source to the host device for processing, the architectural data including a set of architectural objects which represent a set of architectural features of the architectural layout, wherein inputting the architectural data from the data source includes extracting a set of object data from the set of architectural objects, the object data representing a subset of the set of architectural features;
  in response to executing the ingestion operation to input the architectural data for processing, executing, by the design-model management application of the host device, a determining operation to determine a set of spatial zones based on processing of the architectural data indicating a group of polytopes in the set of architectural objects, wherein determining the set of spatial zones includes processing the set of object data and computing the set of spatial zones based on the set of object data, and wherein determining the set of spatial zones further includes processing the set of architectural objects to determine a set of polytopes, comprising:
    allocating, for the set of spatial zones, at least one architectural object coupled with the set of polytopes; and
    appending, for the design-model, at least one architectural object coupled with the group of polytopes; and
  in response to executing the determining operation to determine the set of spatial zones, executing, by the design-model management application of the host device, an establishing operation to establish, based on the set of spatial zones, a design-model of the architectural layout.

16. The computer program product of claim 15, wherein the program instructions are stored in the computer readable storage medium in a data processing system, and wherein the program instructions were downloaded over a network from a remote data processing system.

17. The computer program product of claim 15, wherein the program instructions are stored in the computer readable storage medium in a server data processing system, and wherein the program instructions are downloaded over a network to a remote data processing system for use in a second computer readable storage medium with the remote data processing system.

* * * * *